United States Patent
Garimella et al.

(10) Patent No.: US 12,354,835 B2
(45) Date of Patent: Jul. 8, 2025

(54) SYSTEMS AND METHODS FOR SELECTIVE MOLECULAR ION DEPOSITION

(71) Applicant: Battelle Memorial Institute, Richland, WA (US)

(72) Inventors: Sandilya V. B. Garimella, Richland, WA (US); Yehia M. Ibrahim, West Richland, WA (US); Ailin Li, Richland, WA (US); Richard D. Smith, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 930 days.

(21) Appl. No.: 17/314,928

(22) Filed: May 7, 2021

(65) Prior Publication Data

US 2021/0351003 A1    Nov. 11, 2021

Related U.S. Application Data

(60) Provisional application No. 63/021,582, filed on May 7, 2020.

(51) Int. Cl.
*H01J 37/317* (2006.01)
*H01J 27/02* (2006.01)
(Continued)

(52) U.S. Cl.
CPC ........ *H01J 37/3178* (2013.01); *H01J 27/022* (2013.01); *H01J 37/3007* (2013.01);
(Continued)

(58) Field of Classification Search
CPC .. H01J 37/3178; H01J 37/3007; H01J 27/002; H01J 49/00; H01J 49/004;
(Continued)

(56) References Cited

U.S. PATENT DOCUMENTS 5,789,745 A * 8/1998 Martin ................ H01J 49/0018
250/281
8,835,839 B1 * 9/2014 Anderson ............. H01J 49/062
250/290

(Continued)

OTHER PUBLICATIONS

Borsdorf et al., "Ion mobility spectrometry: principles and applications," *Applied Spectroscopy Reviews* 41(4): 323-375, Aug. 2006.
(Continued)

*Primary Examiner* — Brian K Talbot
(74) *Attorney, Agent, or Firm* — Klarquist Sparkman, LLP

(57) ABSTRACT

Methods include directing a group of ions through a separation region of an ion manipulation apparatus, separating the group of ions in the separation region based on ion mobility, selecting a subset of the group of ions based on a dependence between ion mobility and ion arrival time of the separated ions at a deposition switch of the ion manipulation apparatus, and depositing the selected subset of ions on a substrate. Related systems and ion manipulation apparatus are disclosed. Also disclosed are methods and system that provide concurrent ion accumulation and ion separation in coupled and switchable electrode regions using traveling wave electric fields.

18 Claims, 24 Drawing Sheets

(51) Int. Cl.
| | |
|---|---|
| *H01J 37/30* | (2006.01) |
| *B33Y 10/00* | (2015.01) |
| *B33Y 30/00* | (2015.01) |
| *G01N 27/622* | (2021.01) |
| *G01N 27/623* | (2021.01) |
| *H01J 49/00* | (2006.01) |
| *H01J 49/06* | (2006.01) |

(52) U.S. Cl.
CPC .............. *B33Y 10/00* (2014.12); *B33Y 30/00* (2014.12); *G01N 27/622* (2013.01); *G01N 27/623* (2021.01); *H01J 49/00* (2013.01); *H01J 49/004* (2013.01); *H01J 49/06* (2013.01)

(58) Field of Classification Search
CPC .......... H01J 49/06; B33Y 10/00; B33Y 30/00; G01N 27/622; G01N 27/623
USPC ......................................................... 427/523
See application file for complete search history.

(56) References Cited

U.S. PATENT DOCUMENTS

| | | | | |
|---|---|---|---|---|
| 11,322,340 | B2* | 5/2022 | Hamid | H01J 49/061 |
| 11,874,252 | B2* | 1/2024 | DeBord | G01N 27/623 |
| 2001/0032929 | A1* | 10/2001 | Fuhrer | H01J 49/06 |
| | | | | 250/281 |
| 2009/0101810 | A1* | 4/2009 | McLean | G01N 27/622 |
| | | | | 250/282 |
| 2016/0071715 | A1* | 3/2016 | Anderson | H01J 49/062 |
| | | | | 315/111.81 |
| 2016/0329202 | A1* | 11/2016 | Fries | H01J 49/16 |
| 2017/0076931 | A1* | 3/2017 | Ibrahim | H01J 49/40 |
| 2018/0002806 | A1* | 1/2018 | Verbeck, IV | C23C 14/52 |
| 2018/0068839 | A1* | 3/2018 | Ibrahim | H01J 49/4235 |
| 2019/0348268 | A1* | 11/2019 | Hamid | H01J 49/062 |
| 2020/0378922 | A1* | 12/2020 | Ibrahim | H01J 49/4225 |
| 2021/0239650 | A1* | 8/2021 | Hollerbach | H01J 49/26 |
| 2021/0319994 | A1* | 10/2021 | Jarrell | H01J 49/164 |
| 2024/0170274 | A1* | 5/2024 | McCabe | G01N 27/622 |

OTHER PUBLICATIONS

Clowers et al., "Enhanced ion utilization efficiency using an electrodynamic ion funnel trap as an injection mechanism for ion mobility spectrometry," *Analytical Chemistry* 80(3): 612-623, Feb. 2008.
Clowers et al., "Pseudorandom sequence modifications for ion mobility orthogonal time-of-flight mass spectrometry," *Analytical Chemistry* 80(7): 2464-2473, Apr. 2008.
Cumeras et al., "Review on ion mobility spectrometry. Part 1: current instrumentation." *Analyst* 140(5): 1376-1390, Mar. 2015.
De la Mora et al., "Differential mobility analysis of molecular ions and nanometer particles," *TrAC Trends in Analytical Chemistry* 17(6): 328-339, Jun. 1998.
Deng et al., "Compression ratio ion mobility programming (CRIMP) accumulation and compression of billions of ions for ion mobility-mass spectrometry using traveling waves in structures for lossless ion manipulations (SLIM)," *Analytical Chemistry* 89(12): 6432-6439, Jun. 2017.
Deng et al., "Greatly increasing trapped ion populations for mobility separations using traveling waves in structures for lossless ion manipulations," *Analytical Chemistry* 88(20): 10143-10150, Oct. 2016.
Deng et al. "Ion mobility separations of isomers based upon long path length structures for lossless ion manipulations combined with mass spectrometry." *ChemistrySelect* 1(10): 2396-2399, Jul. 2016.
Deng et al., "Serpentine ultralong path with extended routing (SUPER) high resolution traveling wave ion mobility-MS using structures for lossless ion manipulations," *Analytical Chemistry* 89(8): 4628-4634, Apr. 2017.
Deng et al., "Ultra-high resolution ion mobility separations utilizing traveling waves in a 13 m serpentine path length structures for lossless ion manipulations module," *Analytical Chemistry* 88(18): 8957-8964, Sep. 2016.
Dugourd et al., "High-resolution ion mobility measurements," *Review of Scientific Instruments* 68(2): 1122-1129, Feb. 1997.
Gabelica et al., "Fundamentals of ion mobility spectrometry," *Current Opinion in Chemical Biology* 42: 51-59, Feb. 2018.
Garimella et al., "Ion manipulations in structures for lossless ion manipulations (SLIM): computational evaluation of a 90° turn and a switch," *Analyst* 140(20): 6845-6852, Sep. 2015.
Garimella et al., "Simulation of electric potentials and ion motion in planar electrode structures for lossless ion manipulations (SLIM)," *Journal of The American Society for Mass Spectrometry* 25(11): 1890-1896, Sep. 2014.
Garimella et al., "Squeezing of ion populations and peaks in traveling wave ion mobility separations and structures for lossless ion manipulations using compression ratio ion mobility programming," *Analytical Chemistry* 88(23): 11877-11885, Dec. 2016.
Groessl et al., "High resolution ion mobility-mass spectrometry for separation and identification of isomeric lipids," *Analyst* 140(20): 6904-6911, Aug. 2015.
Guevremont, "High-field asymmetric waveform ion mobility spectrometry: a new tool for mass spectrometry," *Journal of Chromatography A* 1058(1-2): 3-19, Nov. 2004.
Hamid et al., "Characterization of traveling wave ion mobility separations in structures for lossless ion manipulations," *Analytical Chemistry* 87(22): 11301-11308, Nov. 2015.
Harris et al., "Direct analysis in real time coupled to multiplexed drift tube ion mobility spectrometry for detecting toxic chemicals," *Analytical Chemistry* 83(6): 1908-1915, Mar. 2011.
Hofmann et al., "Glycan analysis by ion mobility-mass spectrometry," *Angewandte Chemie International Edition* 56(29): 8342-8349, Jul. 2017.
Ibrahim et al., "Development of an ion mobility spectrometry-orbitrap mass spectrometer platform," *Analytical Chemistry* 88(24): 12152-12160, Dec. 2016.
Kemper, "A new, higher resolution, ion mobility mass spectrometer." *International Journal of Mass Spectrometry* 287(1-3): 46-57, Oct. 2009.
Kloniecki et al., "Ion mobility separation coupled with MS detects two structural states of Alzheimer's disease Aβ1-40 peptide oligomers," *Journal of Molecular Biology* 407(1): 110-124, Mar. 2011.
Lanucara et al., "The power of ion mobility-mass spectrometry for structural characterization and the study of conformational dynamics," *Nature Chemistry* 6(4): 281-294, Apr. 2014.
Li et al., "A simulation study of the influence of the traveling wave patterns on ion mobility separations in structures for lossless ion manipulations," *Analyst* 145(1): 240-248, Dec. 2020.
Mason et al., "Transport properties of ions in gases," Chapter 2.5-2.6, Oct. 5, 1988 (52 pages).
May et al. "Conformational ordering of biomolecules in the gas phase: nitrogen collision cross sections measured on a prototype high resolution drift tube ion mobility-mass spectrometer," *Analytical Chemistry* 86(4): 2107-2116, Feb. 2014.
Michelmann et al., "Fundamentals of trapped ion mobility spectrometry," *Journal of the American Society for Mass Spectrometry* 26(1): 14-24, Oct. 2014.
Paglia et al., "Metabolomics and lipidomics using traveling-wave ion mobility mass spectrometry," *Nature Protocols* 12(4): 797-813, Apr. 2017.
Plasencia et al., "Resolving and assigning N-linked glycan structural isomers from ovalbumin by IMS-MS," *Journal of the American Society for Mass Spectrometry* 19(11): 1706-1715, Nov. 2008.
Shvartsburg et al., "Fundamentals of traveling wave ion mobility spectrometry," *Analytical Chemistry* 80(24): 9689-9699, Dec. 2008.
Szumlas et al., "Hadamard transform ion mobility spectrometry," *Analytical Chemistry* 78(13): 4474-4481, Jul. 2006.
Viehland et al., "Comparison of high-field ion mobility obtained from drift tubes and a FAIMS apparatus," *International Journal of Mass Spectrometry* 197(1-3): 123-130, Feb. 2000.

(56) References Cited

OTHER PUBLICATIONS

Wu et al., "Separation of isomeric peptides using electrospray ionization/high-resolution ion mobility spectrometry," *Analytical Chemistry* 72(2): 391-395, Jan. 2000.

Zheng et al., "Utilizing ion mobility spectrometry and mass spectrometry for the analysis of polycyclic aromatic hydrocarbons, polychlorinated biphenyls, polybrominated diphenyl ethers and their metabolites," *Analytica Chimica Acta* 1037: 265-273, Dec. 2018.

Zucker et al., "An ion mobility/ion trap/photodissociation instrument for characterization of ion structure," *Journal of the American Society for Mass Spectrometry* 22(9): 1477-1485, Jul. 2011.

\* cited by examiner

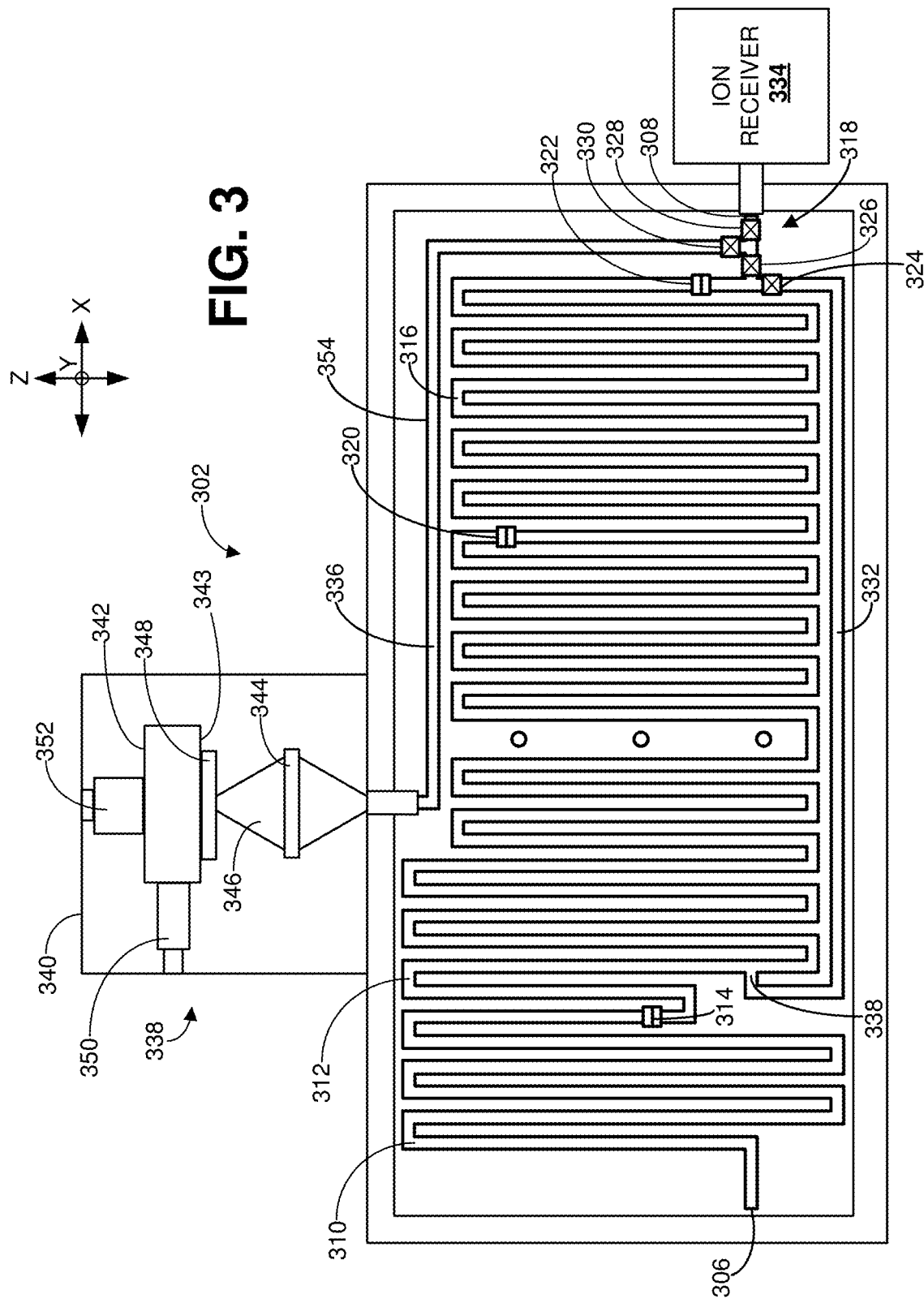

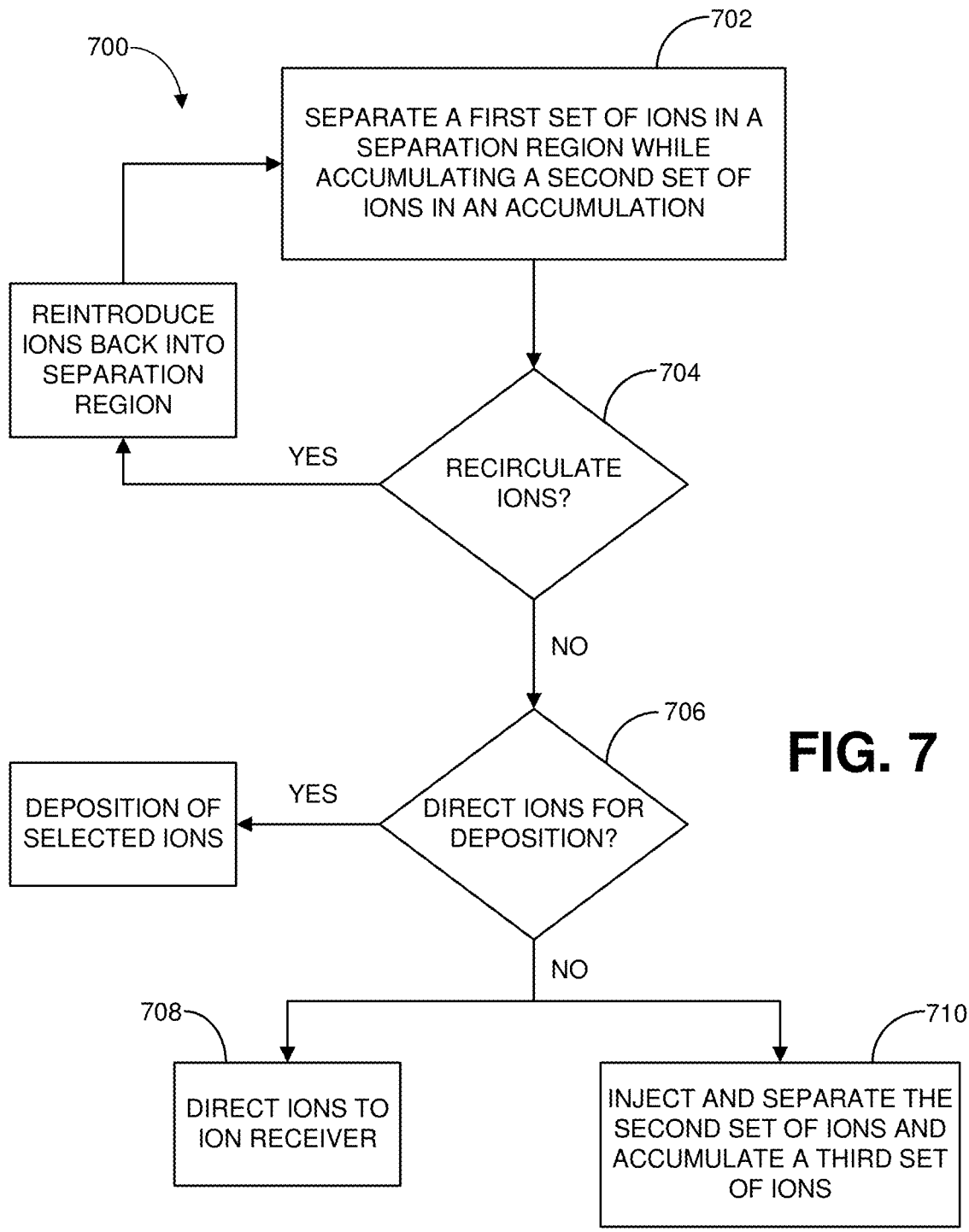

SYSTEMS AND METHODS FOR SELECTIVE MOLECULAR ION DEPOSITION

CROSS REFERENCE TO RELATED APPLICATION

This application claims the benefit of U.S. Provisional Application No. 63/021,582, filed May 7, 2020. The prior application is incorporated herein by reference in its entirety.

ACKNOWLEDGMENT OF GOVERNMENT SUPPORT

This invention was made with Government Support under Contract DE-AC05-76RL01830 awarded by the U.S. Department of Energy. The Government has certain rights in the invention.

FIELD

The present disclosure relates to ion manipulation.

BACKGROUND

The ability to separate ions using ion mobility and mass spectrometry provides separation based on molecular mass and size. Previous approaches to mass selective ion deposition are typically limited to a selected mass of the ions. Further, previous approaches deposit small amounts of material over extensive timeframes, making deposition impractical. Accordingly, a need remains for new approaches to selective ion deposition.

SUMMARY

According to one aspect of the disclosed technology, a method includes directing a group of ions through a separation region of an ion manipulation apparatus, separating the group of ions in the separation region based on ion mobility, selecting a subset of the group of ions based on a dependence between ion mobility and ion arrival time of the separated ions at a deposition switch of the ion manipulation apparatus, and depositing the selected subset of ions on a substrate.

In some representative method examples of the disclosed technology, selecting the subset of ions based on the ion arrival time at the deposition switch includes selecting one or more structures of a molecule based on predetermined expected ion arrival times at the deposition switch for the selected one or more structures. The selecting a subset of the group of ions includes switching the deposition switch to direct the separated ions to the deposition region based on the ion arrival time. The ions of the group of ions can have a common mass-to-charge ratio and/or mass spectrum peak. In some examples, the selected subset of ions includes fewer than all of a plurality of ion structures included in the group of ions. In some examples, the selected subset of ions includes fewer than all of a plurality of isomers included in the group of ions. In still further examples, the selecting the subset of the group of ions includes selecting from an ion mobility spectrum fewer than all of a plurality of ion mobility peaks corresponding to the selected subset of ions. The method includes, in some examples, before selecting the subset of the group of ions, directing the group of ions to an ion receiver coupled to an ion exit of the ion manipulation apparatus and configured to provide mass selection of the ions from which the subset of the group of ions is selected.

In additional representative method examples of the disclosed technology, the group of ions is a first group of ions earlier received from an accumulation region coupled to the separation region. In some method examples, the method includes accumulating a second a group of ions in the accumulation region while separating the first group of ions in the separation region. In further method examples, the method includes reintroducing the group of ions having traveled at least partially through the separation region back into the separation region. Compressing at least a portion of the group of ions separated in the separation region is included in some method examples.

In certain representative method examples of the disclosed technology, the method includes separating the separated ions based on ion polarity using an applied voltage difference by separating ions of different polarity spatially in a common channel of the ion manipulation apparatus and/or by separating ions of different polarity to propagate along different polarity-specific paths. In some method examples, depositing the selected subset ions includes depositing the separated ions at predetermined locations on the substrate, at a common location on the substrate, on different respective substrates, and/or printing three-dimensional structures using the separated ions.

In some representative method examples of the disclosed technology, the method further includes confirming the selection of the subset by directing other ions of the group of ions that are not part of the subset to a mass spectrometer and comparing a detected time-dependent ion arrival time profile from the mass spectrometer with an expected time-dependent ion arrival time profile.

According to another aspect of the disclosed technology, an ion separation apparatus includes an ion separation region configured to receive and separate ions based on ion mobility, an ion switch region, and an ion deposition region coupled to the separation region through the switch region and configured to direct separated ions received from the separation region for ion deposition on a substrate. The switch region is configured to receive, and direct ions separated by the separation region to the deposition region based on an ion arrival time of the separated ions at the switch region. The ion arrival time of the separated ions is based on ion mobility of the separated ions. In some examples, an ion deposition system coupled to an outlet of the deposition region is configured to deposit ions received from the deposition region at predetermined locations on the substrate. The switch region, in some examples, is configured to receive, and direct ions separated by the separation region to the deposition region, a recirculation region, and/or an ion receiver based on one or more ion properties.

In some representative examples of the disclosed technology, the ion separation apparatus further includes a recirculation region configured to receive and recirculate ions separated by the separation region back into the separation region. In still further examples, the deposition system includes a movement stage configured to adjust a position of the substrate and a focus lens configured to direct ions received from the deposition region to the substrate. In such examples, the deposition system is configured to deposit ions received from the deposition region at a common location and/or distinct locations on the substrate with the movement stage and focus lens. In other examples, the deposition system includes a 3D ion printer configured to print three-dimensional structures. A least a portion of the deposition system is a vacuum pressurized deposition region having a pressure ranging from 1 torr to $10^{-8}$ torr in still further examples.

In some representative examples, the ion separation apparatus includes an ion gate, and an ion accumulation region configured to receive and accumulate ions and coupled to the separation region through the ion gate. The separation region is configured to separate received accumulated ions based on ion mobility, and wherein the accumulation region is configured to accumulate received ions while the separation region is separating the received accumulated ions. In some examples, the ion separation apparatus includes an ion compression region coupled to the separation region and configured to compress peaks of separated ions received from the separation region. An ion exit, in some examples, is configured to couple ions separated by the separation region to an ion receiver. The ion receiver is a mass spectrometer and/or an ion analytical device. The deposition region is also configured to further separate ions separated by the separation region based on ion polarity in further examples.

According to a further aspect of the disclosed technology, a multi-ion separator system includes a plurality of the ion separation apparatus descried herein, an ion source, and a flow splitter coupled to the ion source that directs ions from the ion source to each of the ion separation apparatus. In some examples, the multi-ion separator system further includes an ion deposition system coupled to the plurality of ion separation apparatus. The substrate, in some examples, is a common substrate and the deposition system is configured to deposit ions separated by each ion separation apparatus on the common substrate. In other examples, the substrate includes a plurality of substrates and the deposition system is configured to deposit ions separated by each ion separation apparatus on one or more of the substrates. The ion source, in still further examples, includes a syringe pump.

According to an additional aspect of the disclosed technology, an ion separation apparatus includes an ion accumulation region configured to receive and accumulate ions, an ion gate, and an ion separation region coupled to the ion accumulation region through the ion gate and configured to receive accumulated ions from the accumulation region. The separation region is configured to separate received accumulated ions based on one or more ion properties, and wherein the accumulation region is configured to accumulate received ions while the separation region is separating the received accumulated ions.

In some representative examples, the ion separation apparatus further includes a switch region configured to receive ions separated by the separation region and to direct the separated ions to a recirculation region, a deposition region, and/or an ion receiver. The ion separation apparatus, in still further examples, includes an ion compression region coupled to the separation region and configured to compress peaks of the ions received from the separation region. In some examples, the ion separation apparatus further includes a recirculation region configured to receive and recirculate ions separated by the separation region back into the separation region. An ion exit configured to couple ions separated by the separation region to an ion receiver is included in some examples. The ion receiver is a mass spectrometer and/or ion analytical device.

In further representative examples, the ion separation apparatus includes an ion deposition region configured to direct ions separated by the separation region for deposition on a substrate. The deposition region, in some examples, is configured to further separate ions from the separation region based on ion polarity. The ion separation apparatus, in further examples, also includes an ion deposition system coupled to an output of the ion deposition region and configured to deposit ions received from the ion deposition region on predetermined locations of the substrate. The ion deposition system includes a movement stage configured to adjust a position of the substrate and a focus lens configured to direct the received ions to the substrate, wherein the ion deposition system is configured to deposit ions at a common location on the substrate with the movement stage and focus lens. In some examples, the deposition system includes a 3D ion printer configured to print three-dimensional structures using separated ions. At least a portion of the ion deposition system is, in some examples, a vacuum pressurized deposition region having a pressure ranging from 1 torr to $10^{-8}$ torr.

In some representative examples of the disclosed technology, a multi-SLIM system includes a plurality of the above ion separation apparatus, an ion source, and a flow splitter coupled to the ion source that directs ions from the ion source to each of the ion separation apparatus. In some examples, the ion source includes a syringe pump. An ion deposition system coupled to the plurality of ion separation apparatus is included in some examples. The substrate is a common substrate, in some examples, and the ion deposition system is configured to deposit ions separated by each ion separation apparatus on the common substrate. In other examples, the ion deposition system is configured to deposit ions received from the different ion separation apparatus on different respective substrates.

According to an additional aspect of the disclosed technology, a method includes separating a first set of ions in a separation region of an ion manipulation apparatus received from an accumulation region while accumulating a second set of ions in the accumulation region. The accumulation region is coupled to the separation region through an ion gate configured to inject the second set of ions into the separation region. After separating the first set of ions in the separation region, in some examples, the method includes injecting the second set of ions in the accumulation region into the separation region, and separating the second set of ions in the separation region while accumulating a third set of ions in the accumulation region. Reintroducing at least a portion of the first set of ions having traveled at least partially through the separation region back into the separation region is included in further method examples.

In some representative method examples of the disclosed technology, compressing at least a portion of the first set of ions in a compression region of the ion manipulation apparatus while accumulating the second set of ions in the accumulation region is included. The compression region is coupled to the separation region. In still further method examples, accumulating the second set of ions includes accumulating the ions for an accumulation duration and injecting the second set of ions into the separation region for an injection duration, wherein the accumulation duration is greater than the injection duration. Accumulating ions, in some method examples, includes opening an ion entrance gate proximate an input of the accumulation region to release ions into the accumulation region during the accumulation duration, and closing the ion entrance gate to block ions from entering the accumulation region during the injection duration. Separating the ions, in further examples, includes separating ions for a separation duration equal to the sum of the accumulation duration and the injection duration. In some representative method examples, an ion utilization efficiency of greater than or substantially equal to 90% is obtained.

According to a further aspect of the disclosed technology, an ion separation apparatus includes a first region and a second region coupled to the first region, the first region including a first plurality of electrodes configured to produce a first traveling waveform configured to accumulate ions in the first region and the second region including a second plurality of electrodes configured to produce a second traveling waveform configured to separate ions in the second region while ions are accumulated in the first region.

In some representative examples of the disclosed technology, the ion separation apparatus includes a blocking electrode arrangement situated at an interface between the first region and the second region and configured to produce a blocking electric field that is greater than an amplitude of the first traveling waveform such that the ions in the first region are blocked from entering the second region. The blocking electrode arrangement is configured to change the blocking electric field at the interface of the first region and the second region and the first plurality of electrodes are configured to increase a parameter of the first traveling waveform to a surfing voltage such that ions from the first region are injected into the second region. An ion gate proximate the first region, in some examples, is configured to open during accumulation of ions in the first region and to close while ions from the first region are injected into the second region. In additional examples, the second region voltage is greater than the first region voltage during ion accumulation in the first region and ion separation in the second region.

In further representative examples of the disclosed technology, the ion separation includes a third region coupled to the second region, the third region including a third plurality of electrodes configured to produce a third traveling waveform configured to separate and/or compress ions while ions are accumulated in the first region. In still further examples, the ion separation apparatus includes a recirculation channel including a fourth plurality of electrodes configured to produce the second traveling waveform. The recirculation channel is configured to receive and reintroduce ions that have traveled at least partially through the second region back into the second region. The ion separation apparatus, in some examples, includes one or more switches configured to direct ions that have traveled through the second region to an ion receiver, a deposition region, or a combination thereof. The first region and/or the second region, in further examples, includes electrodes configured to produce an opposite phase radio frequency (RF) voltage while producing the first traveling waveform and/or second traveling waveform.

In some representative examples of the disclosed technology, the ion separation apparatus further includes an ion deposition system coupled to an output of the ion deposition region configured to deposit ions received from the ion deposition region at a predetermined location on a substrate.

The foregoing and other objects, features, and advantages of the disclosed technology will become more apparent from the following detailed description, which proceeds with reference to the accompanying figures.

BRIEF DESCRIPTION OF THE DRAWINGS

FIG. 3 is a schematic view of another example ion manipulation apparatus that includes a coupled ion deposition system.

FIG. 7 is a schematic diagram of a representative method for concurrent ion separation and accumulation, according to another example.

DETAILED DESCRIPTION

General Considerations

Figure 1A:
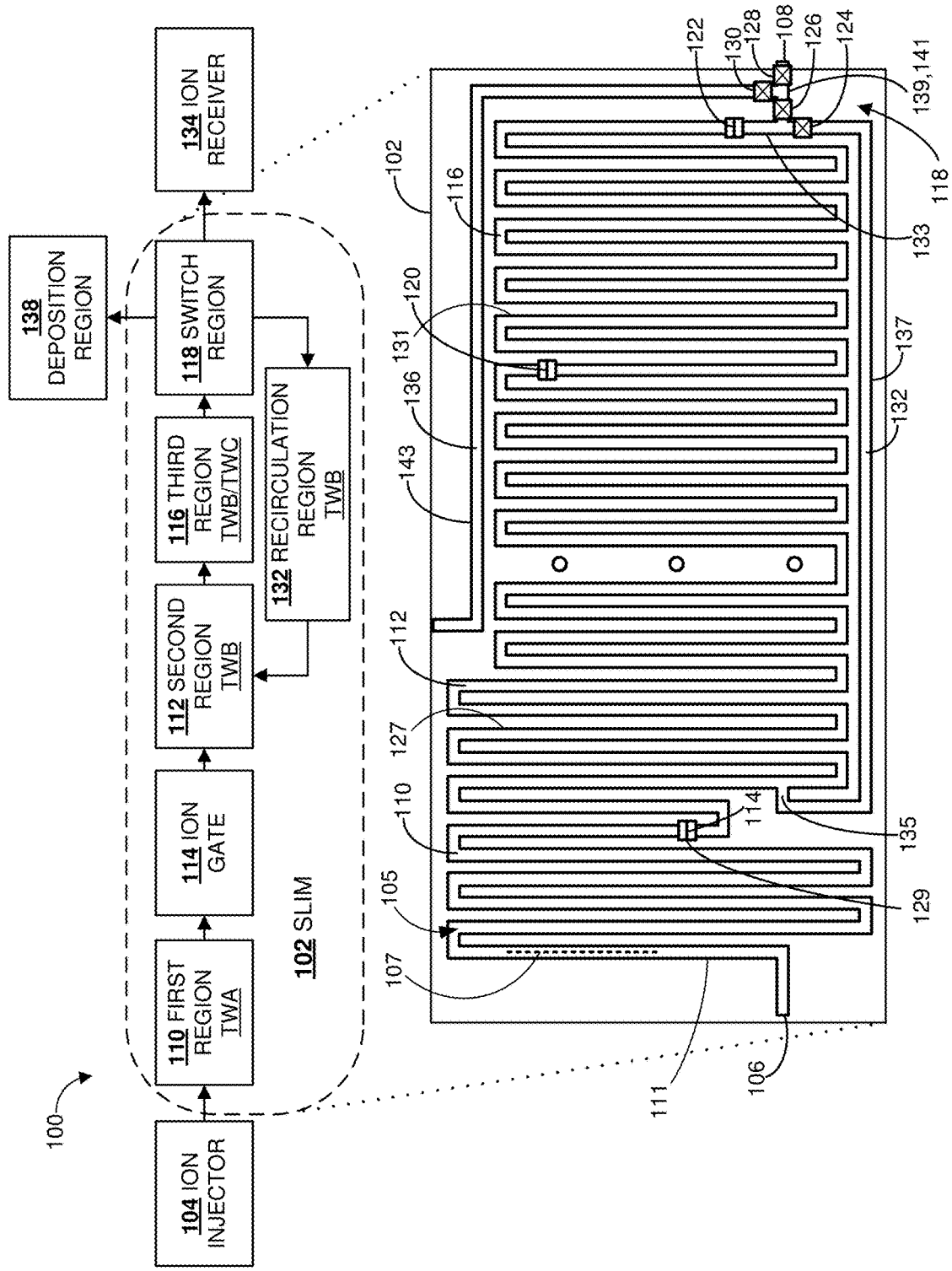
FIG. 1A is a schematic diagram of an ion manipulation system that can provide concurrent ion separation and accumulation and/or selective deposition.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus are referred to as "lowest," "best," "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation. As used herein, thermal contact does not require a direct physical contact but only a thermally conductive path.

Some examples are described in relation to one or more longitudinal and lateral directions generalized to correspond to ion movement or confinement. Directions typically apply to ion movement, trapping, and confinement and are provided by electric fields produced by one or more electrodes that are arranged to define one or more volumes, channels, or paths of various shapes, sizes, and configurations. A direction can correspond to a single path, multiple paths, bi-directional movement, inward movement, outward movement, or a range of movements. Actual ion movement paths vary and can depend on the various characteristics of the electrode and the positional, polarity, kinetic, or other characteristics of the ions received in a confinement volume. Directions referred to herein are generalized and actual specific particle movements typically correspond to electric fields produced and the electrical mobilities of the ions propagating in relation to the electric fields.

The disclosed technology is directed to devices, apparatus, and methods of manipulating ions, including the use of electric fields to create field-defined pathways, traps, conduits, and switches to manipulate ions with minimal or no losses. In some embodiments, complex sequences of ion separations, transfers, path switching, and trapping can occur in the volume provided between electrode arrays situated on one or more surfaces positioned apart from each other. In some examples, ion confining fields are provided by biased or unbiased radio frequency (RF) electric fields. In additional examples, ion confining fields provided by biased or unbiased RF fields and traveling wave electric fields. In representative examples, ions of opposite polarity are moved, trapped, or manipulated using RE electric fields or RF and traveling wave electric fields. RF electric fields are typically applied so that RF fields generated by adjacent RF electrodes are out of phase, typically by approximately 180°, to form an alternating RF field arrangement that inhibits the ions from approaching the electrodes and that provides confinement. Confinement generally refers to inhibiting or restricting ion motion or relative ion motion in one or more directions, or to procedures or devices associated with achieving confinement. Longitudinal confinement can include inhibition of motion or relative motion along an axis of ion transport, such as an ion path. Longitudinal confinement can occur in a surfing mode traveling wave, wherein ions continue to move in a longitudinal direction, but cannot slip with respect to the traveling wave. Longitudinal confinement can also occur in devices such as accumulators or traps. Transverse confinement can include inhibition of motion in directions orthogonal to an axis of ion transport. In some examples described herein, RF confinement or DC guard potentials or combinations can be used to achieve transverse confinement. Transverse confinement can occur independently of longitudinal confinement.

Confinement can be provided over a range of pressures (e.g., less than approximately 0.001 torr to approximately 1000 torr), and over a useful, broad, and adjustable mass to charge (m/z) range associated with the ions. In some examples ions are manipulated for analysis through mass spectrometry or with a mass spectrometer, and where pressures of less than approximately 0.1 torr to approximately 50 torr can be used to readily manipulate ions over a useful m/z range, e.g., m/z 20 to greater than approximately 5,000. In some examples, ion confinement volumes includes gases or reactants. Arrangements of RF electrodes and traveling wave electrodes receive corresponding potentials that allow creation of ion traps and/or conduits in the volume or gap between the electrode arrangements so that lossless or substantially lossless storage and/or movement of ions of the same or different polarities can be achieved, including without the application of static or superimposed direct current (DC) potentials. For example, lossless manipulation can include losses of less than 0.1%, 1%, 5%, or 10% of ions injected into a corresponding ion confinement volume.

Traveling waves are typically created by dynamically applying DC potentials to a plurality of electrodes arranged in one or more sequences. Traveling wave electrode sets can be formed by one or more sequences of traveling wave electrodes situated in series. As the DC potentials are varied between adjacent electrodes of a traveling wave electrode sequence, a traveling wave can be formed with a speed based on the time dependent variation of the DC potentials. Varying traveling wave characteristics can affect and manipulate various movements of ions having different ion mobilities, including producing ion confinement, lossless transport, and ion separation. In some examples, in conjunction with traveling waves, ions can be losslessly confined in an ion confinement volume for extended durations, such as multiple hours. One such characteristic is the traveling wave speed, with ions that have higher mobility moving or surfing with the traveling wave and ions that have lower mobility rolling over and lagging behind the traveling wave to allow ion separation. Another such characteristic is traveling wave amplitude, which can transport ions with lower ion mobilities with a corresponding increase in traveling wave amplitude. Traveling wave amplitudes are typically selected based on ion mobility characteristics and the desired ion manipulation to be in the range of greater than 0 V up to 30 V, 50 V, 80 V, 100 V, or greater. Traveling wave speeds are typically selected based on ion mobility characteristics and the desired ion manipulation to be in the range of less than 5 m/s, 20 m/s 50 m/s, 100 m/s, 200 m/s, or 500 m/s. Traveling wave frequencies are typically selected between 10 kHz and 200 kHz.

In general, traveling waves include at least one trough and at least one crest that propagates along a channel, formed by an electric potential waveform. When used for ion mobility separation, a TW can be continuous or can extend over multiple periods, however this is not a requirement. In other examples, a TW can be a single period (or even as little as half a period) of an oscillatory waveform. Multiple periods of a TW waveform can be regular or irregular, for example, stuttering or burst waveforms can be used in certain applications. When used for ion mobility separation, it can be desirable for the TW amplitude to be below a first threshold at which all ion species of interest can pass over crests from one trough to the next; such a configuration is considered to be in a separation mode. For some directional changes, such as with elevator configurations, it can be desirable for the TW amplitude to be above a second threshold at which no ion species of interest can pass over a crest, i.e., all species of interest experience longitudinal confinement within the TW and can be carried by the TW at the TW speed; such a configuration is considered to be a surfing mode. A TW amplitude that distinguishes surfing mode from separation mode can depend on frequency, wavelength, speed of propagation, or ion species. Some embodiments can be configured so that a surfing mode region is in a surfing mode for all ion species of interest, and a separation mode region is in a separation mode for all species of interest. For a given ion species, a transition between surfing mode and separation mode can also be made by changing the TW frequency while amplitude and wavelength are held fixed. In such a configuration, the TW can operate in separation mode above a threshold frequency, and in surfing mode below the threshold frequency. TW excitation and devices have been described, for example, in U.S. 2019/0004011A1, the contents of which are incorporated herein by reference.

A "SLIM" is a Structure for Lossless Ion Manipulation. Some SLIMs can provide an ion transport path defined by electrodes to which electrical or electromagnetic excitation can be applied. The SLIM can be generally linear (straight or curved), two-dimensional (straight or curved), or three-dimensional. Multi-level SLIMs can be formed by arranging multiple one- or two-dimensional SLIMs on successive layers of a three-dimensional structure, with ion transport channels arranged to couple the successive layers. SLIMs typically arrange electrodes in one or more patterns so that DC traveling waves potentials can be applied to selected electrodes to guide ions along transport paths or channels or provide other manipulation, and so that RF fields can be applied to other selected electrodes (and sometimes common electrodes) to provide ion confinement. Some SLIM devices described herein can provide concurrent ion accumulation and separation.

INTRODUCTION

Disclosed examples can use IMS (e.g., Structures for Lossless Ion manipulations or SLIM) in conjunction with mass spectrometry to create materials by highly selective ion deposition. By using disclosed SLIM/MS coupled systems, selective deposition or soft-landing of ions with mass and structural selectivity can become possible and also practical. This in conjunction with high resolution IMS separation in SLIM can additionally provide scope for enhanced material selectivity in deposition. Additional techniques that enhance ion utilization efficiency by efficient accumulation and separation further enhance the ability to soft-land greater number of molecular ions. Some examples can provide selective deposition without a coupled MS based on predetermined arrival time profiles associated with structural separation.

In relatively long path length separations, notably using SLIMs, separation times combined with traditional ion injection techniques can lead to low ion utilization efficiency and loss of sample. Despite having the ability to accumulate ions for relatively longer times using on-board ion accumulation in SLIM, the long separations that subsequently follow can lead to inefficient ion utilization. Disclosed examples can use concurrent accumulation and separation to substantially increase process efficiency, providing practical time scales for disclosed highly selective deposition approaches.

Ion mobility spectrometry (IMS) is a powerful technique in providing data on chemical structures and physicochemical properties of charged particles based on their mobilities. Ions with different mobilities can be separated, for instance, when they travel in an electric field in the presence of a collision gas under conditions of relatively low electric field to gas density ratios (E/N). Unlike other liquid phase separations, IMS is a relatively fast analysis and when combined with mass spectrometry (MS), becomes a versatile tool for comprehensive ion separation, detection, and characterization in biological analysis.

Various IMS platforms, such as drift tube ion mobility spectrometry (DTIMS) and traveling wave ion mobility spectrometry (TWIMS) provide their own unique advantages. DTIMS, for instance, is a traditional technique that uses constant electric field for ion separation, which separates ions according to their mobilities. The resolution achieved by DTIMS, however, is restricted due to limitations in the maximum voltage drop across the drift tube and/or the length of the drift tube itself. As a result, DTIMS requires a higher voltage drop or conversely, greater drift tube lengths for better resolution. TWIMS on the other hand, can separate ions with low DC voltages using a dynamically propagating electric potential in a varied electric field. With TWIMS, the net potential drop is independent of the path length of the IMS system. This allows for ion turns and serpentine paths of several meters length within SLIM devices and enables greater resolution over DTIMS. Moreover, elements from the separated products of IMS and MS can be useful in several applications, such as energetic materials, biological function studies, high purity synthesis for pharmaceutical applications, and isotopic separation. However, IMS-MS instruments are not utilized for selective material surface preparation because chemical analysis results in destruction of the sample at the analytical device. Collection of material separated and selected based on mass and structure for preparing material and printing molecules using the disclosed SLIM-MS is described.

In addition to the typical operation of SLIM, the concurrent separation and accumulation SLIM technology of the present disclosure can select and deposit material with high selectivity and high ion utilization efficiency. Greater than 95% of ions generated at the source can be separated and a selected species can be collected non-destructively by routing a mass and structure selected peak using selective switching to a deposition region for novel material synthesis.

Although SLIM improves IMS resolution, it also increases ion flight times because of the increased path length, sometimes on the order of several seconds, which causes a reduction in ion utilization. While there have been attempts to improve the ion utilization efficiency of SLIM, these approaches are still limited to utilization of 50% or below. As a result, ion utilization and throughput remain a significant challenge, and efficient deposition of selected molecules is prevented.

To address these challenges, the disclosed SLIM apparatus, systems, and methods can perform ion separation and accumulation concurrently to increase ion utilization and throughput, while maintaining relatively high resolution. The concurrent separation and accumulation achieves near 100% utilization of the ions generated. Unlike SLIM platforms which conduct ion accumulation and separation consecutively, the concurrent SLIM accumulates ions during separation, significantly decreasing analysis times. The analysis time of the concurrent SLIM is nearly half of other SLIM in achieving the same signal intensity and thereby also doubles throughput. This, among other things, also allows for rapid molecular analysis and deposition of ions selected based on mass and structure on collection surfaces.

System and Apparatus Examples

FIG. 1A shows an example ion manipulation system 100, which includes a SLIM 102 situated to receive ions, e.g., from an ion injector 104, through an ion entrance 106. The SLIM 102 can be configured to propagate, separate, trap, and/or move ions from the ion entrance 106 to an ion exit 108 using selectively applied electric potentials to electrodes arranged between the ion entrance 106 and ion exit 108 to define a confinement volume 105. In representative examples, the SLIM 102 includes two or more surfaces, such as opposing surfaces of printed circuit boards, arranged and patterned with a plurality of electrodes. The electrodes are selectively coupled to one or more RF power supplies and/or DC power supplies to provide ion confinement, propagation, and separation using selected RF and DC voltages along an ion path 107. The ion path 107 can include various bends, turns, and/or serpentine shapes that increase an ion path length. A first region 110, second region 112, and third region 116 of the SLIM 102 can be defined along the ion path 107, with separate concurrent traveling wave DC voltages applied to at least the first and second regions 110, 112, as discussed further below.

Figure 1B:
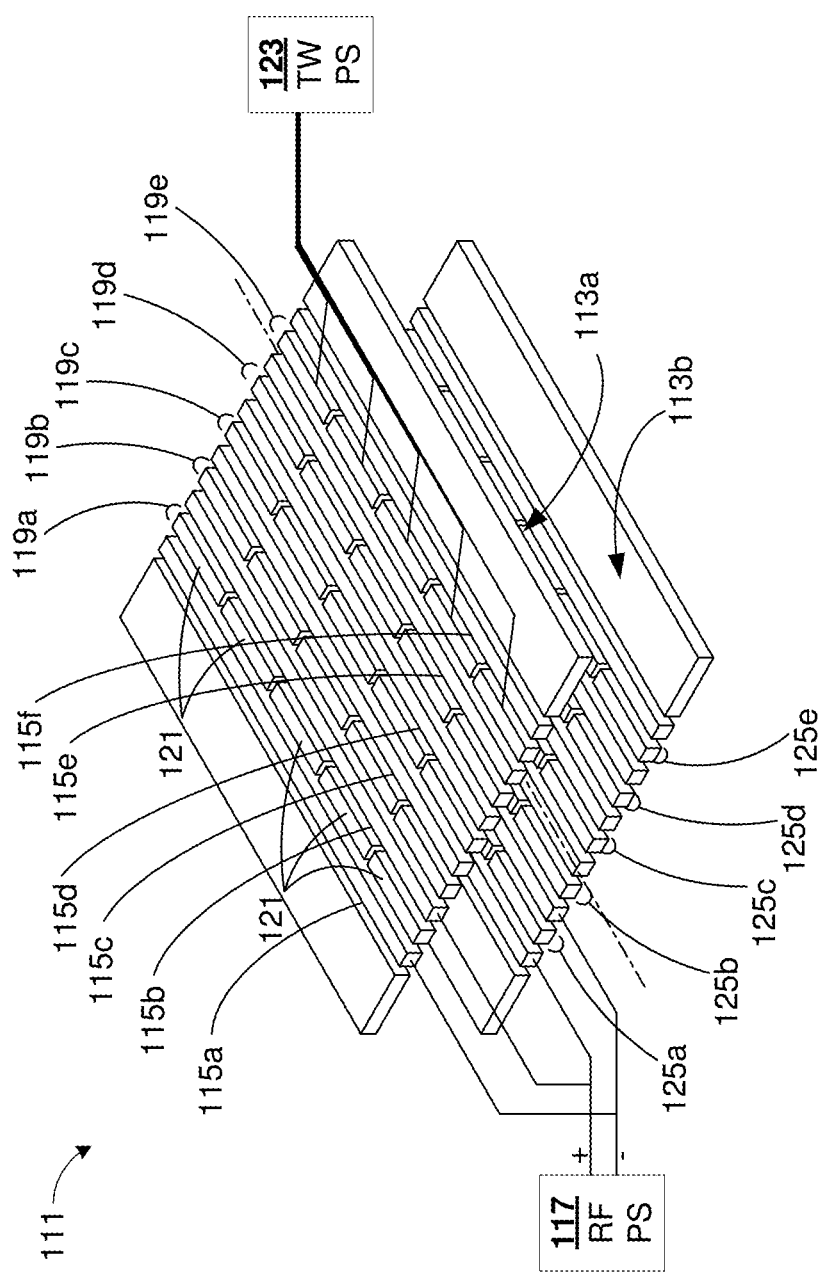
FIG. 1B is a perspective view of an electrode arrangement defining a portion of a confinement volume of the ion manipulation system of FIG. 1A.

FIG. 1B shows an exploded perspective view of a portion of an electrode arrangement 111 at a position along the ion path 107 within the first region 110. The portion of the electrode arrangement 111 shows one possible electrode pattern that can be used in the first region, e.g., extending along the ion path 107 through the first region 110 from the ion entrance 106 to an ion gate 114. The pattern of the portion of the electrode arrangement 111 can also be provided in other portions of the SLIM 102, such as along the ion path 107 in the regions 112, 116 or in other regions. Other arrangements can be provided with different numbers or arrangements of electrodes. Other arrangements specific to selected regions, shapes, switches, etc., can also be provided. The portion of the electrode arrangement 111 includes two opposing surfaces 113a, 113b arranged with a mirrored set of electrodes (with the structure of the surfaces 113a, 113b omitted for clarity). In some examples non-symmetric or non-mirrored arrangements can be used. Surface 113a includes six electrodes 115a-115f arranged in strips and coupled to one or more RF power supply sources 117. The electrodes 115a-115f typically receive RF voltages alternately or adjacently out of phase, e.g., with electrodes 115a, 115c, 115e receiving a first phase and electrodes 115b, 115d, 115f receiving a second phase 180 degrees out of phase from the first phase. The electrodes 115a-115f can be used to confine ions between the opposing surfaces 113a, 113b to retain the ions within the SLIM 102 during confinement and/or manipulation.

Sets 119a-119e of traveling wave electrodes 121 can be interspersed between the electrodes 115a-115f. The traveling wave electrodes 121 of each set are coupled to a DC power supply 123 to receive a dynamically applied DC traveling wave voltage that produces a traveling wave electric field (i.e., traveling waves) within the confinement volume 105 to manipulate ions in the region 110. Dynamically applied DC traveling wave voltage can be applied differently in the second and third regions 112, 116 to produce different ion manipulations. The traveling wave propagates along the direction of ion motion, such as along ion path 107 through the ion confinement volume 105 of the SLIM 102, though other directions and uses for the traveling waves can be used in selected examples. The traveling waves can vary with time and produce a movement, net movement, separation, trapping, accumulation, peak compression, directional change, and/or other manipulations of ions in the confinement volume 105 based on ion characteristics, such as ion mobility or polarity. Traveling wave voltages can be applied such that mirrored voltages are applied to traveling wave electrodes of the opposing surfaces 113a, 113b (e.g., electrodes 125a-125e) though other non-mirrored or altered wave configurations can be used, including in bends, elevators, switches, etc. In some examples, the traveling wave voltage applied defines a square voltage profile.

In some examples, the RF voltages received by the electrodes can vary, for instance, with respect to frequency and amplitude, over time or between adjacent electrodes. In further examples, traveling wave characteristics such as wave speed or amplitude are varied between different traveling electrode arrangements. A control device, such as a computer, controller, etc. can be coupled to or part of any of the power supplies to control electric potentials for the various electrodes, including ion gating, switching, DC and/or RF confinement potentials, and traveling wave sequencing, direction, amplitude, frequency, etc. Typically, a processor can execute computer readable instructions, stored in memory, to carry out the control of electrode potentials and SLIM operation.

In representative examples, the SLIM 102 and/or selected regions of the SLIM 102 are held under low E/N conditions and a pressure ranging from approximately 1 torr to 10 torr. In other examples, ion separation and deposition within the SLIM 102 are operative within a range of pressures ranging from approximately 0.5 torr to 1 atmosphere. In this way, example SLIMs can be operative across a variety of operating conditions and compatible with a variety of platforms, including IMS platforms, particularly those with ion switching capabilities.

The second region 112 can be coupled to the first region 110 through the ion gate 114. The second region 112 can include an electrode arrangement 127, which in some examples can have the same or similar pattern as the portion of the electrode arrangement 111. The electrode arrangements 111, 127 can be coupled to different respective DC power supplies (or a common supply capable of producing distinct DC voltages) to produce different first and second traveling waveforms TWA and TWB, respectively. The traveling waveform TWA is configured to define a traveling wave in the confinement volume 105 in the first region 110 that causes the accumulation of ions. For example, voltage profile of traveling waveform TWA can be configured to provide gentle ion accumulation over an extended duration with minimal or no ion losses. Ion accumulation can occur, e.g., with a traveling wave peak-to-peak amplitude that is relatively low. The traveling waveform TWB has traveling waveform parameters different from TWA and which are configured to define a traveling wave in the confinement volume 105 in the second region 112 that causes a separation of ions over the course of movement along the ion path 107 to an interface 120 coupling the second region 112 to the third region 116. The first region 110 can be referred to as an accumulation region and the second region 112 can be referred to as a separation region.

The ion gate 114 is situated at an interface between the first region 110 and the second region 112 and includes a blocking electrode arrangement 129 configured to receive a static DC voltage or DC voltage gradient to block transmission of accumulated ions and a different voltage, such as a traveling wave voltage, to allow transmission of accumulated ions. During an accumulation time period, the DC voltage applied at the ion gate 114 produces an electric field that blocks ions confined within the first region 110 from entering into the second region 112. During an injection time, the blocking electrode arrangement 129 changes to a non-blocking voltage to direct the accumulated ions from the first region 110 into the second region 112. In representative examples, the electrode arrangement 111 is also supplied with a different traveling wave voltage waveform during the injection time, such as a profile similar to traveling waveform TWB. In some examples, electrodes of the blocking electrode arrangement 129 can correspond to traveling wave electrodes in a series arrangement (such as traveling wave electrodes 121) so that, for example, a contiguous traveling waveform can be produced through ion gate 114 during the injection time.

Figure 2A:
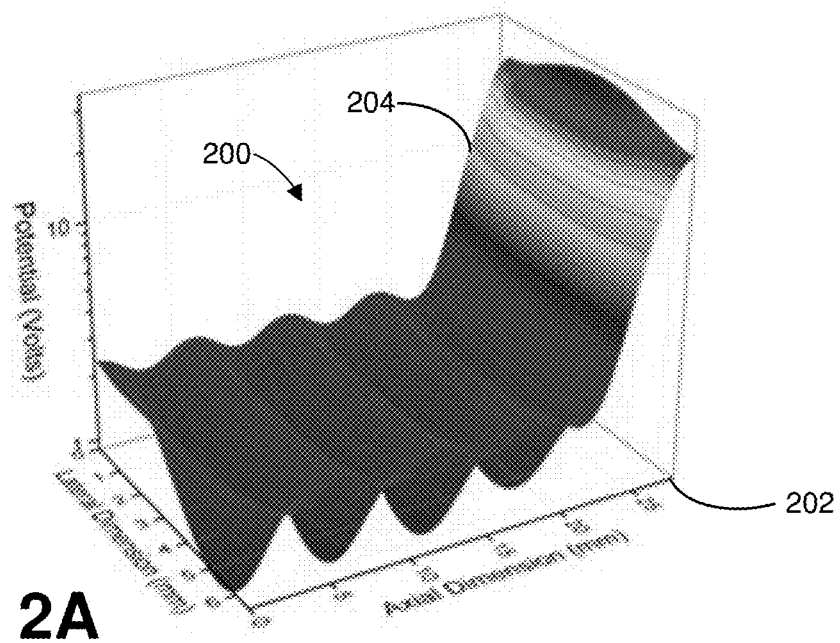
FIG. 2A is a diagram of an electrical potential used in ion accumulation.
Figure 2B:
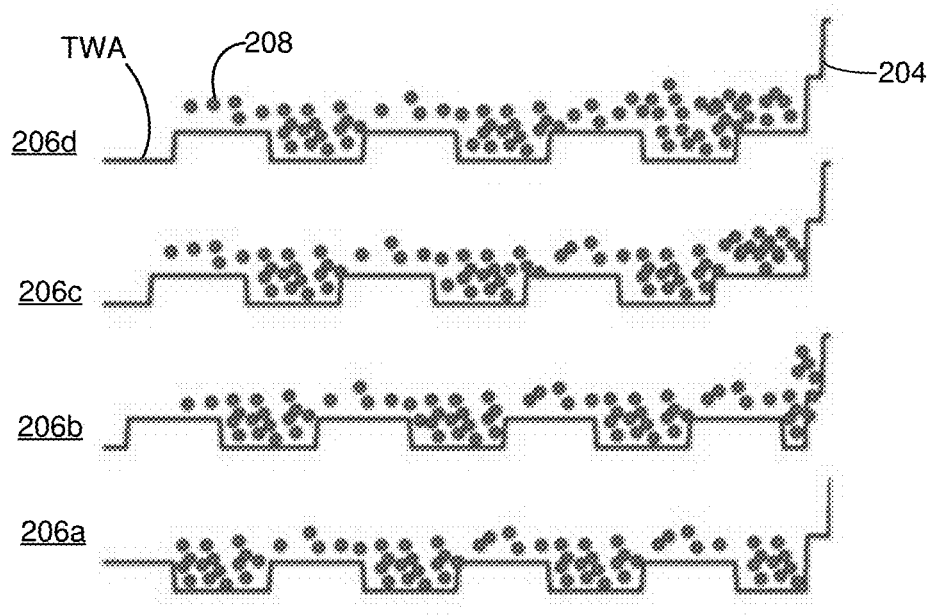
FIG. 2B is a diagram illustrating an ion accumulation process.

The diagrams of FIGS. 2A-2B shows an electric potential surface 200 within a confinement volume that is produced in response to a DC voltage applied to an example set of blocking electrodes, such as to the blocking electrode arrangement 129 of the ion gate 114. The electric potential of the surface 200 confines ions within a first region, such as the first region 110, during an accumulation process. The surface 200 can correspond to the field strength at a selected vertical cross-section of the first region 110. An axial position 202 (at approximately 25-30 mm in the axial dimension) can correspond to an interface between first and second regions, such as the ion gate 114 coupling the first and second regions 110, 112. The relatively high DC voltage 204 at the end of the traveling waveform TWA of first region 110 corresponds to the DC voltage applied at the ion gate 114, creating a blocking voltage allowing ions to accumulate in the first region 110. FIG. 2B is a time sequence 206a-206d of the electric potential surface 200 at a selected lateral position showing a progression as ions 208 move through the first region 110. As the traveling waveform TWA moves through the time sequence 206a-206d, the DC voltage 204 blocks the ions 206 from entering the second region 112 to receive the traveling waveform TWB for separation. At a time of injection of the ions into the second region 112, the DC voltage 204, the traveling wave voltage TWA, or both, are changed, e.g., by decreasing the DC voltage 204 and/or changing the voltage 204 to a traveling wave profile. In some examples, a peak amplitude of the traveling waveform TWA can be greater than the DC voltage 204 after adjustment, or the amplitude of the traveling waveform TWA can be raised to overcome the blocking voltage 204. During injection, the accumulated ions are injected into the second region 112 and received by the traveling waveform TWB. In some examples, the DC voltage 204 and the traveling waveform TWA are changed to correspond to traveling waveform TWB.

As shown in FIG. 1A, the SLIM 102 can also include the third region 116 coupled to the second region 112 at one end, e.g., at an interface 120, and to a switch region 118 at another end, e.g., through an interface 122. The third region 116 includes a third electrode arrangement 131, which in some examples can have the same or a similar pattern as the portion of the electrode arrangement 111 or electrode arrangement 127. The electrode arrangement 131 can be coupled to a DC power supply different from the DC power supply or supplies coupled to the electrode arrangements 111, 127 (or a common supply capable of producing distinct DC voltages) to produce a third traveling waveform TWC defining a third region voltage. At the interface 120 of the second region 112 and third region 116, the ions separated in the second region 112 transition from the second traveling waveform TWB to the traveling waveform TWC. In representative examples, the parameters of the traveling waveform TWC are different from the traveling waveform TWB. In some examples, the traveling waveform TWC is configured to provide ion peak compression of ions received from the second region 112. For example, peak compression in the third region 116 can be used to mitigate diffusion driven peak spreading over long path length separations and achieve higher resolution over a selected mobility range. Accordingly, the third region 116 can be referred to as a compression region. A peak compression region can be referred to as a CRIMP region (Compression Ratio Ion Mobility Programming). Ion compression and CRIMP have been described, for example, in U.S. Pat. No. 10,18,592 and Deng et al., "Compression Ratio Ion Mobility Programming (CRIMP) Accumulation and Compression of Billions of Ions for Ion Mobility-Mass Spectrometry Using Traveling Waves in Structures for Lossless Ion Manipulations (SLIM)," Anal. Chem. vol. 18, no. 12, pp. 6432-6439 (2017), the contents of which are incorporated herein by reference. In particular examples, traveling waveforms producing peak compression include traveling waveforms with a variable duty cycle in which traveling waveforms stutter or burst.

In some examples, the third region 116 can also configured to provide the traveling waveform TWB of the second region 112, e.g., with the traveling wave parameters of TWC being the same as TWB. In this configuration, the third region 116 is an extension of the second region 112 such that the second region 112 effectively extends from the ion gate 114 to the switch region 118 for ion separation. In this way, the electrode arrangement 131 of the third region 116 can be configured to produce and change between the third traveling waveform TWC and the second traveling waveform TWB so that ion separation and compression can be achieved during a common separation window and/or sequential separation windows. In other examples, however, the electrode arrangement 131 of the third region 116 can be configured to produce either the third traveling waveform TWC or the second traveling waveform TWB.

As illustrated in FIG. 1A, the switch region 118 of the SLIM 102 is coupled to the third region 116 at the interface 122 between the regions 116, 118. The switch region 118 can include a plurality of ion switches 124, 126, 128, 130 (e.g., switches using DC voltages). The switch region 118 can include an electrode arrangement 133 configured to direct ions to the switches 124, 126. The switches 124, 126, 128, 130 are situated and configured to direct ions exiting the second region 112 and/or the third region 116 to one or more additional regions of the SLIM 102 or systems coupled to the SLIM 102. For example, switch 124 can be situated to direct ions within the switch region 118 to a recirculation region 132. The recirculation region 132 can include an electrode arrangement 137 be configured to direct ions that have traveled through at least a portion of the second region 112 back into the second region 112, e.g., at a junction 135. The recirculated ions can then proceed through the second region 112 for further separation. The ions can be recirculated once or multiple cycles using the recirculation region 132. The switch 126 can be situated to direct ions into a subregion 139 of the switch region 118 where switches 128, 130 are located. The subregion 139 can include an electrode arrangement 141 configured to direct ions through the subregion 139. The switch 128 can be situated to direct ions moving through the subregion 139 to the ion exit 108. The ion exit 108 can be coupled to an ion receiver 134 for analysis of the ions. The switch 130 can be situated to direct ions to through an alternative exit channel 136 that includes an electrode arrangement 143 directing the ions to a deposition region 138. For example, all ions or one or more selected packets of ions can be directed through the deposition region 138 for deposition on a substrate. In some examples, the alternative exit channel 136 can be referred to as a deposition channel.

In representative examples, the electrode arrangements 133, 137, 141, 143 can be configured to produce the traveling waveform TWB and to direct the ions through each respective ion confinement channel. For example, the electrode arrangements 133, 137 of the switch region 118 and recirculation region 132 are configured to transport ions via the traveling waveform TWB so that ions are seamlessly reintroduced back into the second region 112 for further ion separation. In various examples, the switch, recirculation, and deposition regions and 118, 132, 138 and respective channels can be configured to produce different traveling waveforms and/or voltage for transporting ions.

As indicated above, the arrangement of the recirculation region 132 redirects ions having been at least partially separated within the second region 112 back into the second region 112. Ions having been selected for recirculation reenter the second region 112 at the recirculation junction 135, which can be situated at or proximate the beginning of the second region 112, such as near the ion gate 114. This arrangement of the recirculation region 132 allows for multiple passes of one or more ion packets through the second region 112 while ions are accumulated in the first region 110. The multi-pass arrangement enables selection of a single or multiple ion packets to be cycled through any desired number of separations to achieve a relatively high purity, e.g., greater than 90%, of the selected ion species. After a desired number of multi-pass separations have been completed, switches 128, 130 can be used to direct ion packets to the ion receiver 134 for analysis or to the deposition region 138 for selective deposition, respectively. In some examples, the SLIM 102 does not include a deposition region, does not include a recirculation region, or both.

FIG. 3 is schematic view of a SLIM 302 of an ion manipulation system 300, similar in many respects to the ion manipulation system 100, with like numerals identifying optionally similar structures. The SLIM 302 is coupled to and/or integrated with an ion receiver 334 and deposition system 338. The ion receiver 334 is coupled to an ion exit 308 and configured to receive and analyze ions exiting the SLIM 302. In representative examples, the ion receiver 334 is used to distinguish bond positions, polarity, chiral changes, isomers, isotopes, and/or functionally different ions separated within a second region 312 of the SLIM 302 for highly selective deposition (e.g., a m/z resolution of 500 or greater and an IMS resolution greater than 100). In some examples, the ion receiver 334 is an ion trap, particle counter, a mass spectrometer (MS), such as a time-of-flight MS, and/or any other analytical device that provides mass-to-charge information. In still further examples, the ion receiver 334 is a charge detection mass spectrometer capable of single ion measurements to assist in selecting one or more ion packets for deposition based on the mass, structure, and/or polarity of the ion. In some examples, the analysis of the ion receiver 334 pertaining to the desired species can then be used to select and direct ion packets of interest to the deposition system 338 during concurrent separation and accumulation.

As shown in FIG. 3, the deposition system 338 is coupled to a deposition channel 336 of the SLIM 302 and includes a chamber 340, movement stage 342, and beam focusing lens 344. The deposition system 338 is configured to receive ions 346 directed through the deposition channel 336, such as those ions chosen for highly selective deposition. After one or more ion packets are received, the deposition system 338 is configured to deposit the ions 346 using the beam focusing lens 344 on one or more substrates 348 coupled to a platform 343 of the movement stage 342. In some examples, the movement stage includes actuators 350, 352 that move the platform 343 in various translation and/or rotational directions, such as along or about X, Y, and/or Z axes (e.g., as shown with the coordinate axes in FIG. 3). Movement and positioning of the platform 343 can be coordinated with a switch 330. Deposition of the ions 346 can occur in distinct locations (e.g., having different X, Y, and/or Z coordinates) on the substrate or plate 348 or on more than one substrate, such as to maintain charge and identity of two or more ions species, or in a co-located position on a substrate for reactions/neutralization or charge state adjustment of the ions. In some examples, the deposition system 338 can also be used to print highly selective molecules, single molecules, thin films, and/or monolayers onto surfaces (e.g., electrodes, PCBs, electronic circuits, etc.). In some examples, the deposition system 338 can be part of an additive manufacturing system configured to deposit multiple layers to 3D print structures through selective ion deposition. Such 3D printing capabilities can, for example, be used in designing and fabricating a variety of energy-storage architectures, including batteries.

In further examples, deposition of the ions occurs under low pressure conditions, including approximate pressures of 10 torr or below, which is maintained within the chamber 340. When depositing ions under these pressures, the diameter of the deposited spot of ions can be approximately 1 mm. In other examples, deposition of ions occurs under ultra-high vacuum conditions within the chamber 340, such as within a range of pressures ranging from $10^{-8}$ torr to 1 torr. Under these ultra-high vacuum conditions, the diameter of the deposited spot of ions can be reduced by one or more orders of magnitude than those spots formed under pressures ranging from 10 torr or below. In some examples, deposition or discharge can occur at other pressures, such as atmospheric.

Selected examples can use an electrode arrangement 354 of the deposition channel 336 or another region of the SLIM 302 to further separate ions directed through the deposition channel 336 based on polarity. The electrode arrangement 354 can be referred to as an ion polarity separator in some examples. For instance, a voltage difference (e.g., 8 V) can be applied across a direction perpendicular to a direction of an ion path such that ions moving through the deposition channel 336 are separated across the perpendicular direction according to their respective negative or positive polarity. For example, selected traveling wave, RF, and/or other electrodes of opposing surface 113a can be biased to a positive voltage, e.g., +4 V, and selected traveling wave, RF, and/or other electrodes of opposing surface 113b can be biased to a negative voltage, e.g., −4V. In this instance, negatively charged ions can generally be confined to side regions of the deposition channel 336 adjacent to the electrodes producing a positively biased voltage, while positively charged ions can generally be confined to side regions of the deposition channel 336 adjacent to the electrodes producing a negatively biased voltage. Ions separated by polarity can be received by the deposition system 338 and deposited according to their polarity on the substrate 348. For example, the ions can be deposited in distinct locations using the spatial separation provided by the voltage difference. The ions can also be deposited in a common location, e.g., using the beam focusing lens 344.

Figure 24:
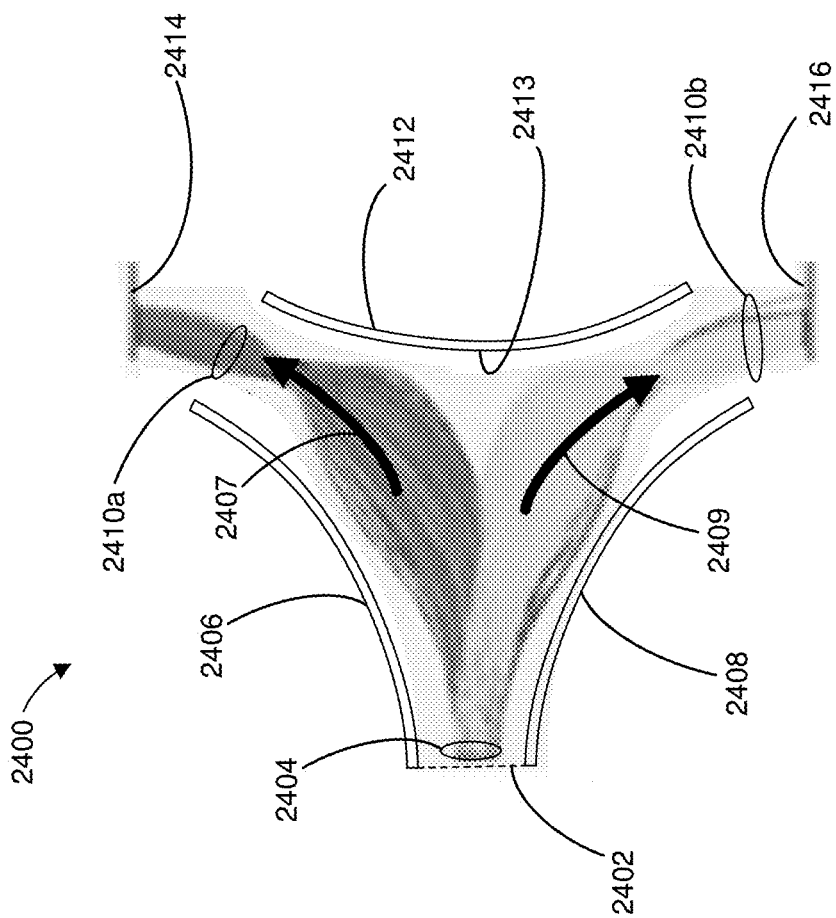
FIG. 24 is a side schematic of an ion polarity separator.

With additional reference to FIG. 24, some example ion deposition systems can include an ion polarity separator 2400 coupled to or part of a SLIM, such as the SLIM 302. The ion polarity separator 2400 can provide separation between negatively and positively charged ions, or can be used to further isolate negatively and positively charged ions separated by one or more previous regions of the SLIM. The separator 2400 includes an ion entrance 2402 through which a group of ions 2404 can be directed. The ions 2404 can have a mix of polarities in a common spatial volume (as shown) or can be spatially separated, such as through a voltage difference across opposing surfaces in a previous region. The separator 2400 includes opposing electrode arrangements 2406, 2408 each biased so that there is voltage difference, e.g., +4V for electrode arrangement 2406 and −4V for electrode arrangement 2408. The electrode arrangements 2406, 2408 can also include traveling wave electrodes and RF electrodes configured to direct ions, together with the biasing voltage difference, along respective polarity specific paths 2407, 2409. Thus, a subset 2410a of the ions 2404 having a negative polarity is directed along path 2407 and a subset 2410b of the ions 2404 having a positive polarity is directed along path 2409. Another electrode arrangement 2412 can be situated across from the ion entrance 2402 or incident path of the group of ions 2404 and applied with voltages to assist with directing the ion subsets 2410a, 2410b along the respective paths 2407, 2409. For example, traveling wave electrodes of the electrode arrangement 2412 can apply traveling wave fields in opposing directions relative to a center or impingement point 2413. The subsets 2410a, 2410b can be directed to and deposited onto respective substrates 2414, 2416. In some instances, the separated negatively and/or positively charged ions can be deposited on surface ions situated on the substrates 2414, 2416 to observe ion interactions.

Figure 16:
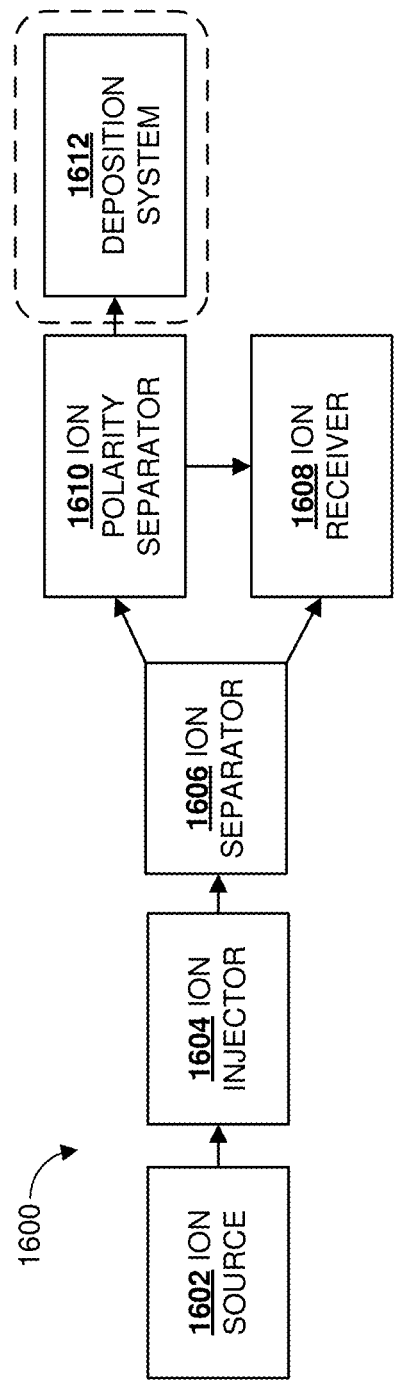
FIG. 16 is a schematic diagram of an ion manipulation system for selective deposition, according to one example.

FIG. 16 is an ion manipulation system 1600 including an ion polarity separator 1610. Ions from an ion source 1602 are received and passed through an ion injector 1604, which is configured to deliver ions to an ion separator 1606. In representative examples, the ion separator 1606 can be a SLIM, e.g., configured providing high ion utilization efficiency through concurrent separation and accumulation. In other examples, a variety of IMS platforms with ion switching capabilities can be used, including drift tube-IMS, high-field asymmetric-IMS, differential mobility analysis, trapped-IMS, and/or other traveling wave-IMS platforms.

As shown in FIG. 16, the ion separator 1606 is coupled to an ion receiver 1608. The ion receiver 1608, in some examples, can be an ion trap, particle counter, a time-of-flight MS, and/or any other analytical device that provides mass-to-charge information, such that mass and mobility spectrums can be produced.

The ion polarity separator 1610 is coupled to the ion separator 1606 to receive separated ions and to a deposition system 1612 configured to selectively deposit ions separated by the ion separator 1606. In representative examples, the ion polarity separator 1610 includes one or more RF and traveling wave electrode arrangements configured for dual polarity ion manipulation to separate ions received from the ion separator 1606 based on polarity. The ion polarity separator 1610 can, for example, be configured to direct ions of different polarities to distinct regions of a common channel the ion manipulation system 1600 by using a biased voltage or other RF and traveling wave profiles. In some examples where ions are separated into distinct regions of a common channel, the separation can occur instead or additionally in the ion separator 1606. Some examples of the ion polarity separator 1610 can separate different ion polarities along different respective paths for deposition by the deposition system 1612. In some examples, the ions separated by the ion polarity separator 1610 are directed to the deposition system 1612 for surface deposition in distinct and/or common locations on one or more substrates. In some examples, the ion polarity separator 1610 can also be coupled to the ion receiver 1608 to couple ions further separated by the ion polarity separator 1610 to the ion receiver 1608 for analysis.

Figure 17:
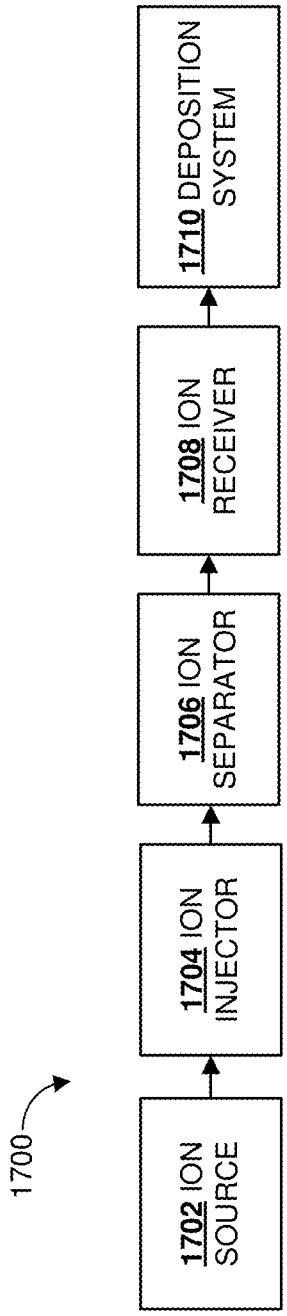
FIG. 17 is a schematic diagram of an ion manipulation system for selective deposition, according to another example.

FIG. 17 is a schematic view of an ion manipulation system 1700 in which an ion receiver 1708 is coupled and situated between an ion separator 1706 and a deposition system 1710. The ion manipulation system 1700 includes an ion source 1702, ion injector 1704, and an ion separator 1706 for separation of one or more ions. The ion manipulation system 1700 is configured to direct separated ion structures directly to an ion receiver 1708 for analysis, such as when using a MS platform. In such configurations, ions directed and moving through the ion receiver 1708 can be deposited in a vacuum behind the ion receiver 1708 and/or through the deposition system 1710. In some examples, the ion receiver 1708 is a mass analyzer (e.g., a quadrupole) situated between the ion separator 1706 and deposition surface. In instances where a SLIM of the disclosed technology is not used, the ion receiver 1708 as a mass analyzer can function as a mass selector to include an additional layer selectivity due to the lower resolution of the alternative IMS systems and methods.

Figure 4:
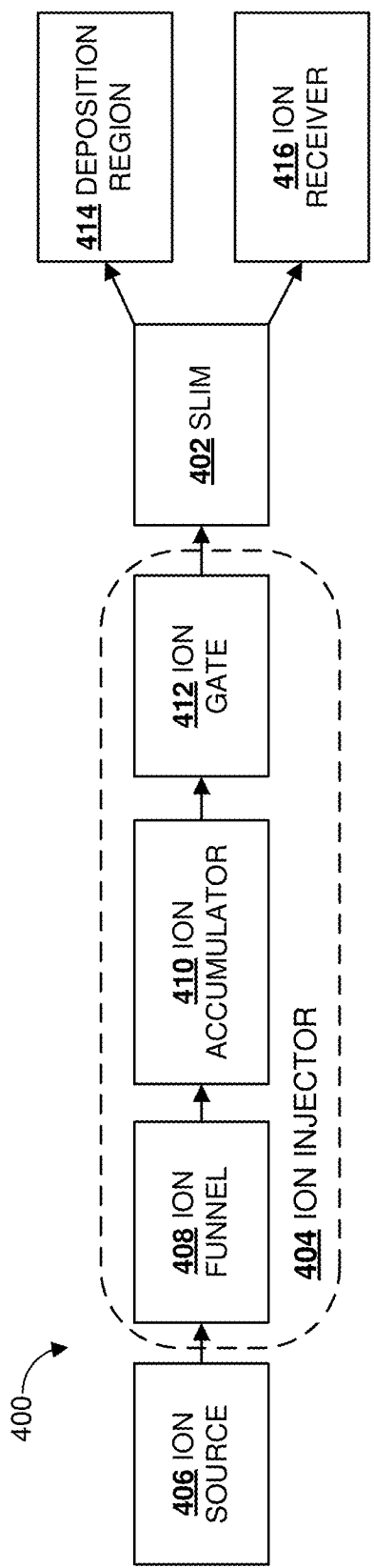
FIG. 4 is a schematic diagram of an ion manipulation system for concurrent ion separation and accumulation, and selective deposition, according to another example.

FIG. 4 is an ion manipulation system 400 employing a SLIM 402 and an ion injector 404. Ions from an ion source 406 are passed through an ion funnel 408 of the ion injector 404. The ion funnel 408 is used to match the spatial angular distribution of the ions to be within an acceptance window of an ion accumulator 410 and thereby collected in the accumulator 410. During collection, an ion gate 412 is maintained in a closed state. After a release criterion has been met, the ion gate 412 is switched to an opened state to release ions from the accumulator 410 into the ion entrance of the SLIM 402. An exemplary release criterion can be during the accumulation of ions within a first region of the SLIM 402, while ions are separated within a second region of the SLIM 402. After a collection criterion has been met, the ion gate 412 is again switched to a closed state. An exemplary collection criterion can be when ions accumulated in the first region of the SLIM 402 are injected to the second region of the SLIM 402 for separation. Ions separated within the SLIM 402 can be directed to a deposition region 414 for deposition or an ion receiver 416 for analysis, as described herein.

Figure 5:
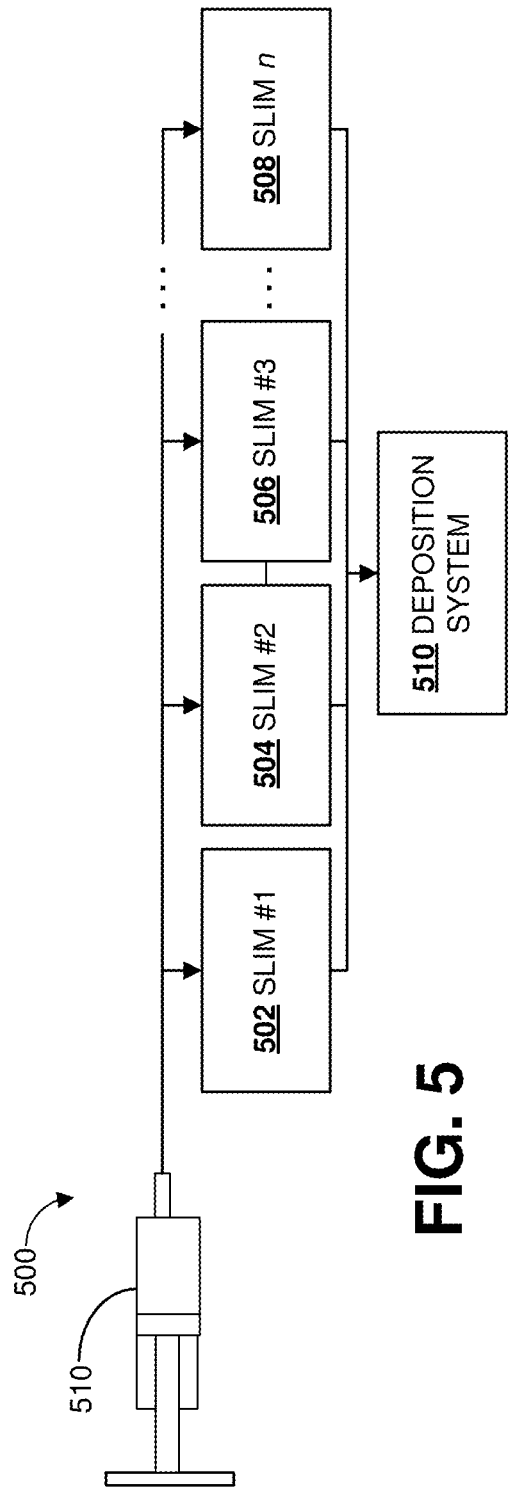
FIG. 5 is a schematic diagram of an ion manipulation system for concurrent ion separation and accumulation, and selective deposition, according to another example.

FIG. 5 shows another example of an ion manipulation system 500 employing n number of SLIMs 502-508 of the disclosed technology, used to increase the scale of ion separation and deposition. In representative examples, each SLIM 502-508 is a separate SLIM apparatus fed ions through a sample syringe pump 510 and coupled to a deposition system 510 (e.g., similar to deposition system 338 or other disclosed deposition systems or components). The deposition system 510 is configured to receive and deposit separated ions from each SLIM 502-508 on one or more substrates as ions are received. The deposition system 510 in this multi-SLIM arrangement, for instance, can be used to deposit and/or print selected ions at different times, such as when a selected ion structure is isolated in each SLIM 502-508 and ready for surface deposition. In other examples, the SLIMs 502-508 are all contained within a single vacuum chamber. In the above examples, a single substrate can be aligned with the SLIMs 502-508 to collect multiple deposits, or each SLIM 502-508 can have its own substrate for deposition.

Although the ion manipulation system 500 is described as including a plurality of SLIMs of the disclosed technology, the ion manipulation system need not include a SLIM. In some examples, the ion manipulation system 500 can use variety of IMS platforms to provide ion mobility separation. Alternative IMS platforms can, for example, include drift tube-IMS, high-field asymmetric-IMS, differential mobility analysis, trapped-IMS, and/or other traveling wave-IMS platforms.

Concurrent Separation and
Accumulation—Example 1

Figure 6A:
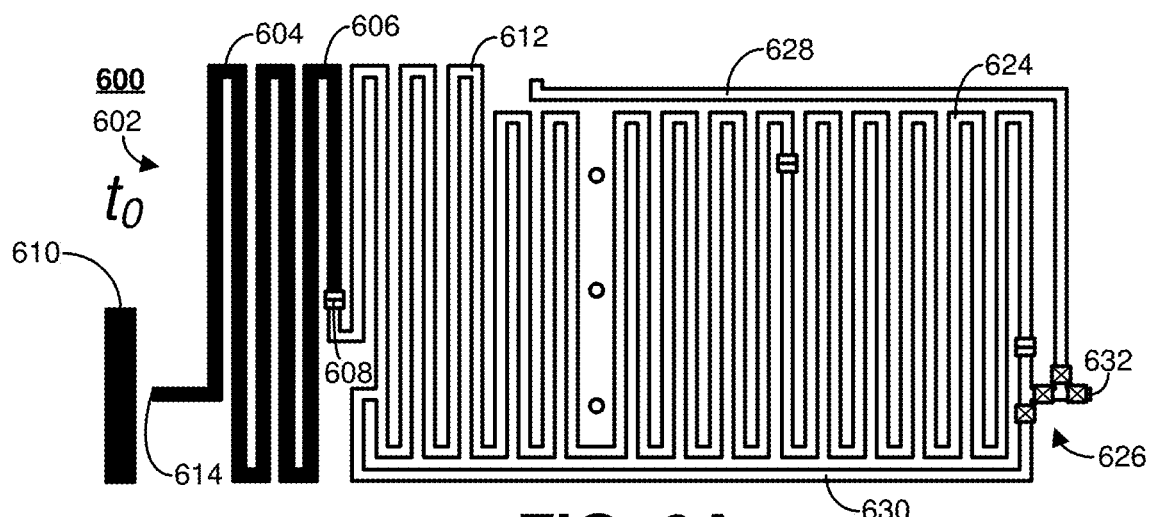
FIGS. 6A-6F are a time series of diagrams illustrative of a representative method for concurrent ion separation and accumulation, according to one example.

FIGS. 6A-6F are a time series of diagrams illustrative of a representative method 600 for concurrent ion separation and accumulation using a SLIM 602 of the disclosed technology. FIG. 6A shows the SLIM 602 at a time $t_0$ immediately before injection of an accumulated ion set 604 and the beginning of a separation window. At time to, the ion set 604 is confined within a confinement volume of an accumulation region 606 of the SLIM 602 between an ion entrance 614 and an ion gate 608. The ion set 604 can include ions from one or more ion pulses received from an ion gate 610, such as a Bradbury-Nielson grid gate, situated upstream from the ion entrance 614. The ion gate 610 at time $t_0$ is in a closed state such that the flow of ions into the SLIM 602 is stopped.

The ion gate 608 is situated at an interface between the accumulation region 606 and a separation region 612. The ion gate 608 is configured to produce a DC voltage to confine ions within the accumulation region 606 during concurrent ion accumulation in the accumulation region 606 and ion separation in the separation region 612. The ion gate 608 is also configured to produce a traveling wave profile (or another non-blocking potential) during an injection time to inject the ions into the separation region 612 for separation. At time to, just before an ion injection, the ion gate 608 produces a DC voltage which is greater than a peak voltage of a traveling waveform TWA of the accumulation region 606, such that the ion set 604 remains confined in the accumulation region 606.

Figure 6B:
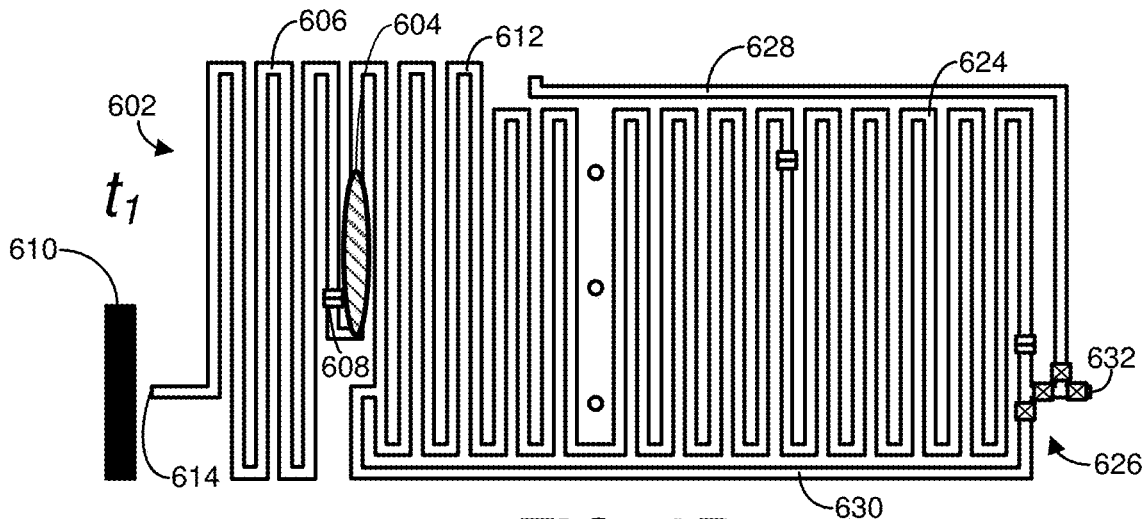

As shown in FIG. 6B, at time $t_1$, at the end of an ion injection period or just after an ion injection period, the ion set 604 has been injected into the separation region 612 to begin separation. During injection of the ion set 604, i.e., between $t_0$ and $t_1$, a DC voltage at the ion gate 608 is changed to a non-blocking voltage, e.g., by changing from a fixed DC blocking voltage to a lower fixed value or by changing to a traveling wave profile that can match one or more parameters of the traveling waveform TWA of the accumulation region 606 or a traveling waveform TWB of the separation region 612. As shown at $t_1$, the ion set 604 has been injected into the separation region 612 and traveling waveform TWB of the separation region 612 is applied to the ion set 604 to produce a separation. In representative examples, the ion gate 610 upstream from the SLIM 602 remains in a closed state during the injection.

In representative examples, the amplitude of the traveling waveform TWA is also increased to a surfing voltage during injection. The increase to a surfing voltage can be of various forms, such as a fixed rate ramp-up, ramp-up and ramp-down, stepped, curved, variable shape, discontinuous, etc. Increasing the voltage of the traveling waveform TWA while maintaining the ion gate 610 upstream in a closed state can, for instance, increase the rate of injection and likelihood the ions within ion set 604 are injected completely. Increasing the amplitude of the traveling waveform TWA can be at a fixed rate can be used to avoid activating the ions being injected and associated losses. In other examples, the duration of injection, or in other words, the length of time the DC voltage of the ion gate 608 is changed to a non-blocking voltage, is selected so that the duration is sufficiently long for ions to be injected completely (or near completely) and sufficiently short so as to avoid an undesired increase in analysis times. Example selections of injection times are further described in working examples below.

Figure 6C:
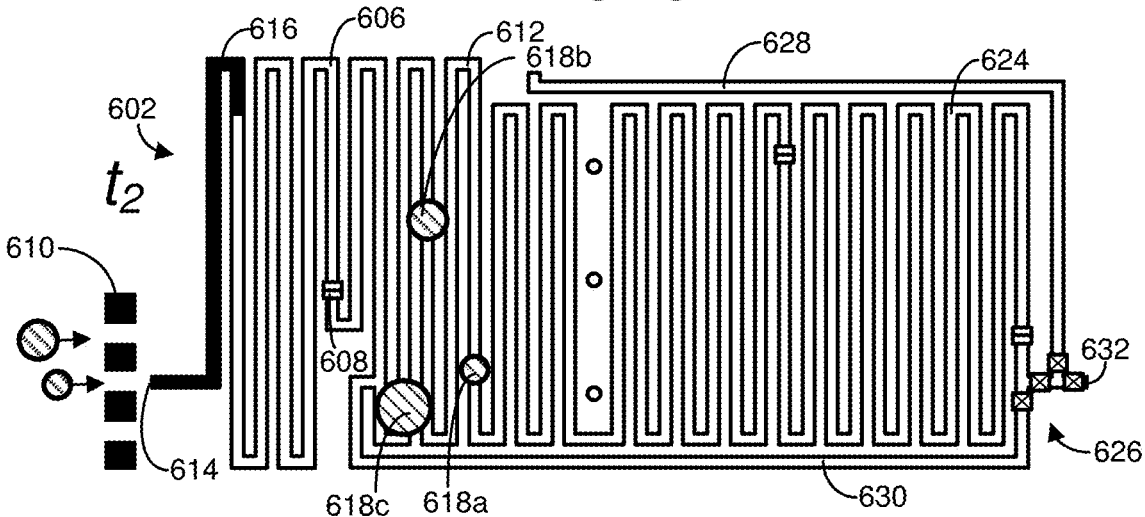

FIG. 6C shows a time $t_2$ which is after an injection period is complete and the SLIM 602 is proceeding with a concurrent ion separation and accumulation. At time $t_2$, the DC voltage produced by the ion gate 608 has been restored to a value greater than an amplitude of an accumulation traveling waveform TWA applied to the accumulation region 606. In examples where the amplitude of the traveling waveform TWA is increased during injection, the amplitude of the traveling waveform is decreased to its accumulation traveling wave amplitude. Concurrently or near the time at which the DC voltage of the ion gate 608 is increased to a restored or blocking voltage, the ion gate 610 upstream from the SLIM 602 is switched to an opened state allowing flow of ions into the accumulation region 606 through the entrance 614. Accumulation of a second ion packet 616 then proceeds within the accumulation region 606.

Concurrent with the accumulation of ion set 616, ion packets 618a, 618b, 618c form through separation of the ion set 604 recently injected into the separation region 612. The ion packets 618a-618c begin to form and separate based on one or more ion characteristics, such as ion polarities and/or ion mobilities and the applied waveform TWB. In the example shown in FIG. 6C, the ion packets 618a-618c begin to separate via the traveling waveform TWB of the separation region 612 based on ion mobilities. That is, ion packet 618a moves through the separation region at a rate greater than ion packets 618b, 618c, while ion packet 618b moves through the separation region at a rate greater than ion packet 618c.

Figure 6D:
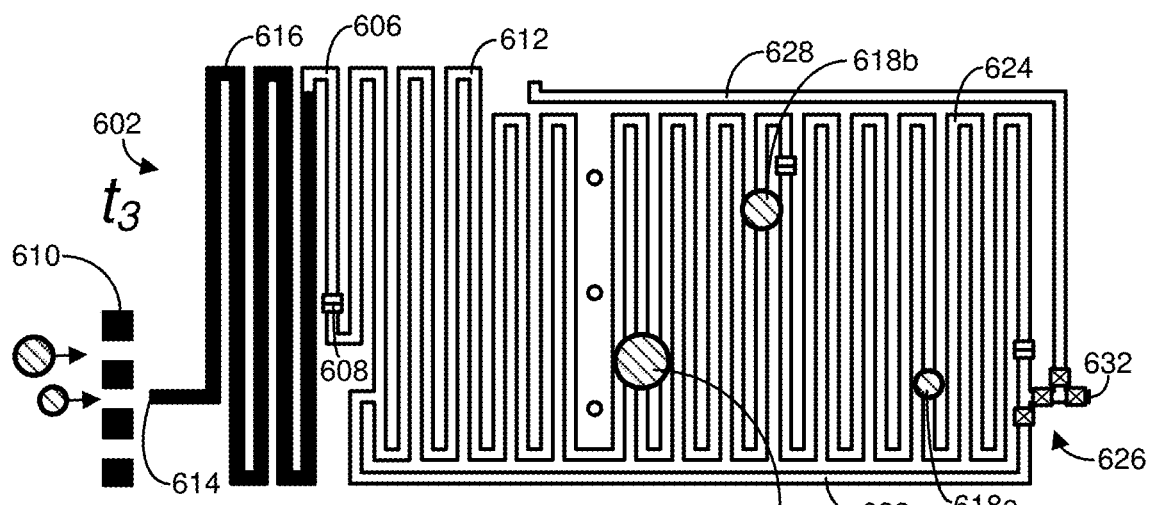

At a time $t_3$, ion packets 618a-618c continue to separate as they move through the separation region 612 while ions are accumulated in the accumulation region 606. As shown in FIG. 6D, the ion packet 618a, now within a compression region 624 of the SLIM 602, is manipulated by a traveling waveform TWC which can be different from TWB. For example, the traveling waveform TWC can include a stuttering or variable duty cycle traveling waveform that can increase the peak intensity or narrow peak width, thereby reducing a peak spreading that can occur in ion packets over long path lengths, such as a single or multiple passes through the SLIM 602. In some examples, the compression region 624 can be configured to produce the traveling waveform TWB such that the separation region 612 is extended to a switch region 626. In this case, the ion packets 618a-618c further undergo separation as they move toward the switch region 626.

Figure 6E:
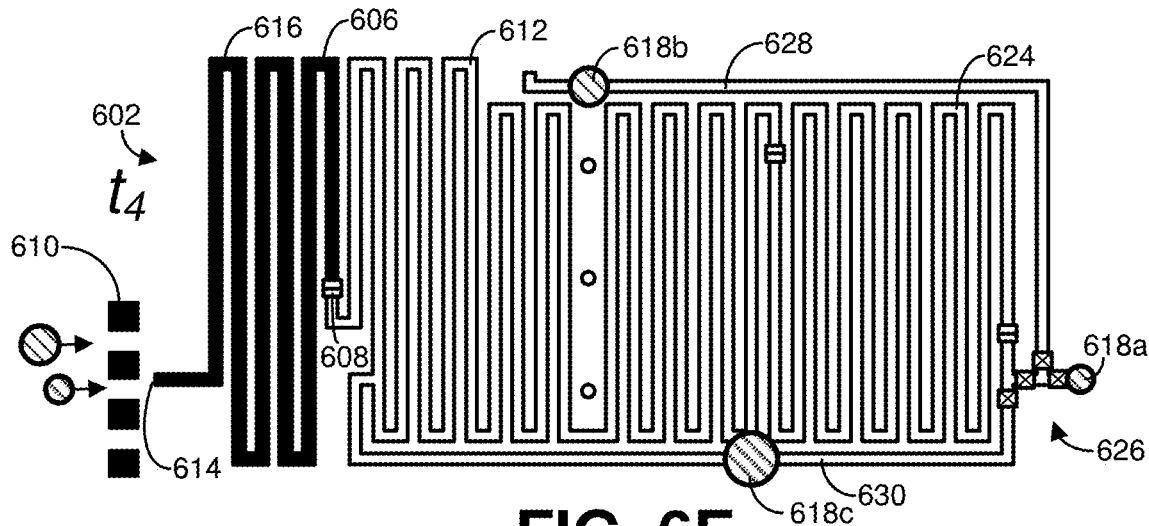
Figure 6F:
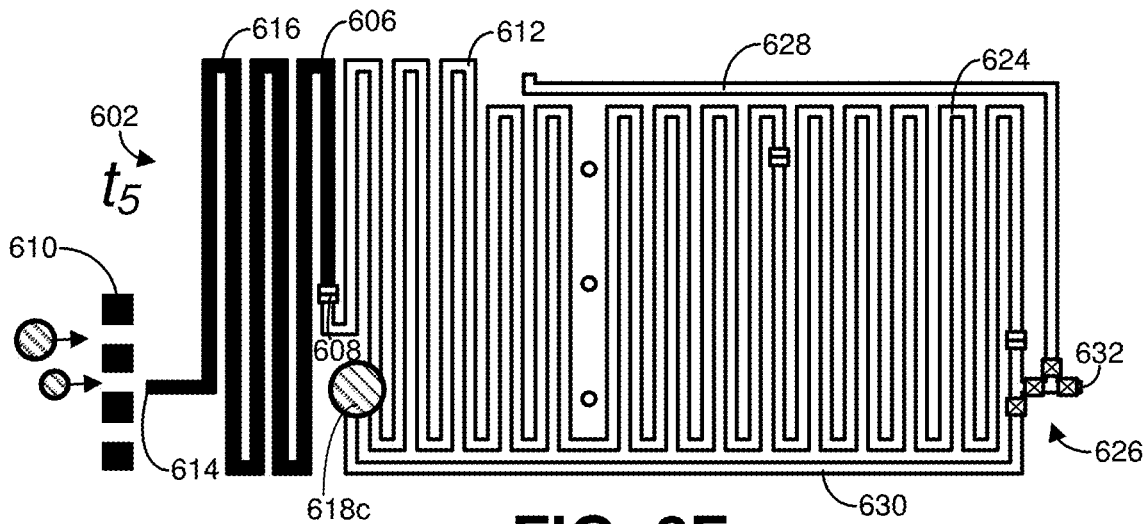

FIG. 6E shows that at a time $t_4$, as ions continue to accumulate in the accumulation region 606, the ion packets 618a-618c having exited the separation region 612 and/or compression region 624 approach the switch region 626 where they are directed for recirculation, deposition or filtering, or analysis. By way of example, as shown in FIG. 6E, the ion packet 618a is directed to an ion exit 632 to be received by an ion receiver (e.g., ion receiver 134, 334) and ion packet 618b is directed to a deposition channel 628 for deposition (e.g., deposition system 138, 338). The ion packet 618c is directed to the recirculation region 630 and thereby reintroduced into the separation region 612 to be subjected to further separation, as illustrated in FIG. 6F at a time $t_5$. Ion packets with selected mobilities, e.g., ion packet 618b, can be routed separately from other packets for filtering or dumping of selected ions, e.g., based on the different ion mobilities and respective movement speeds through the ion separation and/or compression regions.

In some examples, after the ion packet 618c is selected for deposition or analysis, another concurrent ion separation and accumulation cycle can immediately begin such that the second ion set 616 is injected into the separation region 612 and a third ion set begins to accumulate. In some examples, the cycle can be repeated tens, hundreds, or thousands of cycles to achieve the desired separation for an intended deposition and/or analysis. In some examples, an injection can occur while one or more ion packets are within a region of the SLIM 602 downstream from the ion gate 608. In still further examples, one or more ion packets within a given separation window can be recirculated a selected number of times for further separation and/or peak compression for deposition and analysis.

In other examples, the total duration of a single separation window, which can also be referred to as a separation time, is equal to the total time of accumulation and injection for that window. Due to the relatively short nature of the injection time, in such examples, the separation time and accumulation time can be substantially the same and differ, e.g., only by the selected injection time. In some examples, the concurrent ion separation and accumulation of the disclosed technology can achieve an ion utilization efficiency greater than 80%, 85%, 90%, or 95% (e.g., 100%). This degree of ion utilization efficiency can be achieved, e.g., when the time of accumulation of ions approaches the total time for ion analysis.

Concurrent Separation and
Accumulation—Example 2

FIG. 7 is a method 700 of concurrently separating and accumulating ions using a SLIM. At 702, the method 700 includes separating a first set of ions in a separation region of an ion manipulation apparatus while accumulating a second set of ions in an accumulation region of the ion manipulation apparatus. The first set of ions being separated within the separation region at 702, can be ions earlier received from the accumulation region through an ion gate of the ion manipulation device. The ion gate is situated at an interface of the separation region and the accumulation region where the two regions are coupled and configured to inject ions from the accumulation region to the separation region.

At 704, one or more ion packets of the first set of ions having traveled at least partially through the separation region can be selected for recirculation and reintroduced back into the separation region for further separation. Any one of the ion packets can be recirculated any number of times. If one or more ion packets are not selected for recirculation and/or at the end of a multi-pass separation through the separation region, at 704 the ion packets can be directed to a switch region, where each ion packet is directed to an exit, such as a deposition region at 706 or to an ion receiver at 708 via an ion exit. In some examples, in directing one or more ion packets to the deposition region, the ion packets are selected for deposition based on one or more ion characteristics, such as mass and/or ion polarity.

After the ion packets have been directed to the deposition region or ion receiver, at 710 the second set of ions in the accumulation region can be injected into the separation region and the second set of ions can be separated in the separation region while a third set of ions is accumulated in the accumulation region. Accumulation and separation can be repeated in a similar manner for any number of cycles.

Concurrent Separation and
Accumulation—Example 3

Figure 8:
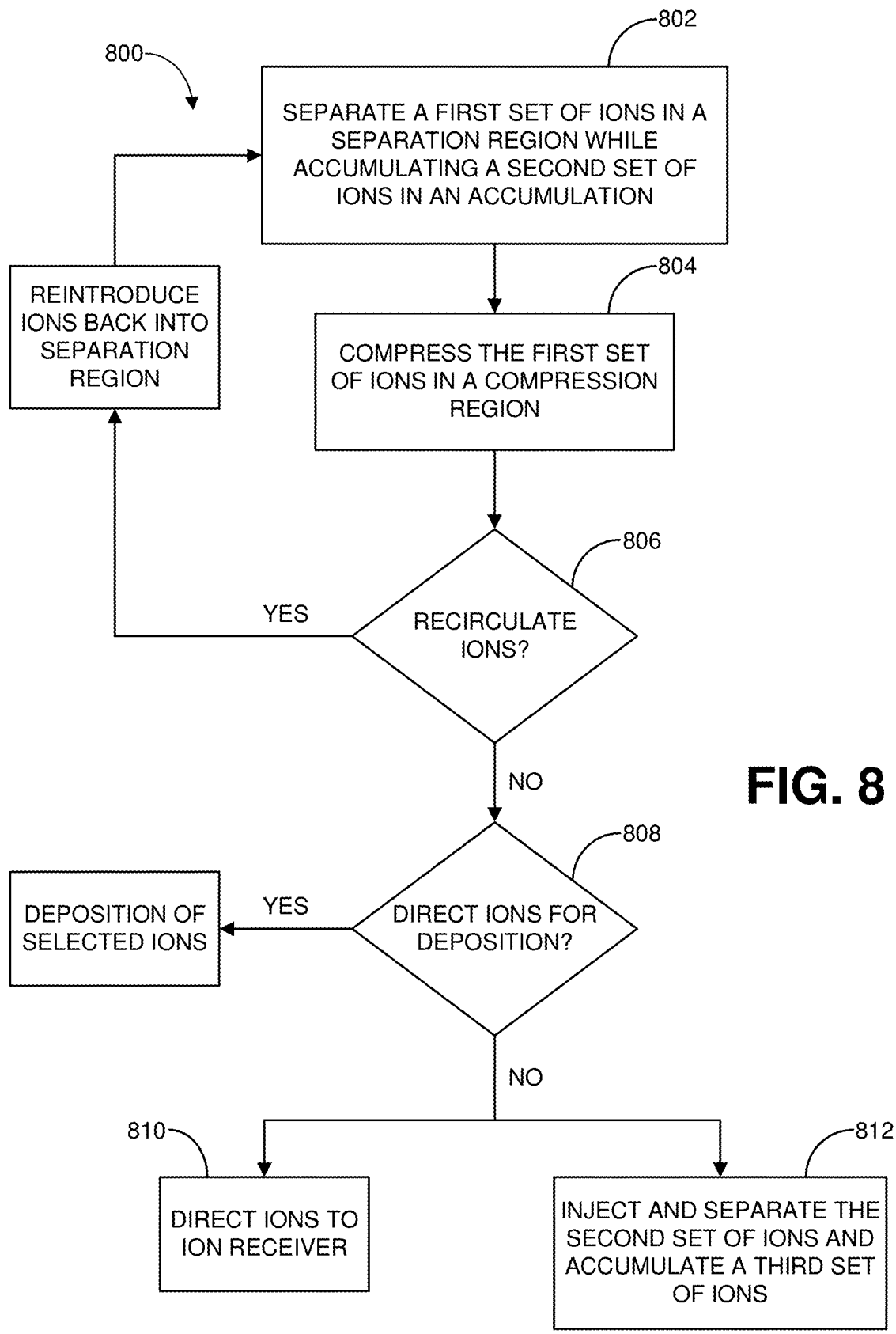
FIG. 8 is a schematic diagram of a representative method for concurrent ion separation and accumulation, according to another example.

FIG. 8 is a method 800 for concurrent ion separation and accumulation using a SLIM of the disclosed technology. The method 800 is similar to the method 700, but further includes ion peak compression. For instance, at 802, the method 800 includes separating a first set of ions in a separation region of an ion manipulation apparatus while accumulating a second set of ions in an accumulation region of the ion manipulation apparatus. An ion gate situated at an interface of the separation region and the accumulation region is configured to inject ions from the accumulation region into the separation region.

At 804, the method 800 includes compressing at least a portion of the first set of ions in a compression region of the ion manipulation apparatus while accumulating the second set of ions in the accumulation region. The compression region is coupled to the separation region at one end and a switch region of the ion manipulation apparatus on the other end.

At 806, one or more ion packets of the first set of ions having traveled at least partially through the separation region and compression region, can be selected for recirculation and reintroduced back into the separation region for further separation and ion compression. If one or more ion packets are not selected for recirculation and/or are at the end of multi-passes through the separation region, at 806 the ion packets can be directed to a switch region, where each ion packet is directed to either a deposition region at 808 or to an ion receiver at 810 via an ion exit. In some examples, in directing one or more ion packets to the deposition region, the ion packets are selected for deposition based on one or more ion characteristics, such as ion mass and/or polarity.

After the ion packets have been directed to the deposition region or ion receiver, at 812 the method 800 includes injecting the second set of ions in the accumulation region into the separation region and separating the second set of ions in the separation region while accumulating a third set of ions in the accumulation region. Accordingly, the method 800 can be repeated in a similar manner for any number of cycles.

Concurrent Separation and Accumulation—Working Example 1

Figure 9:
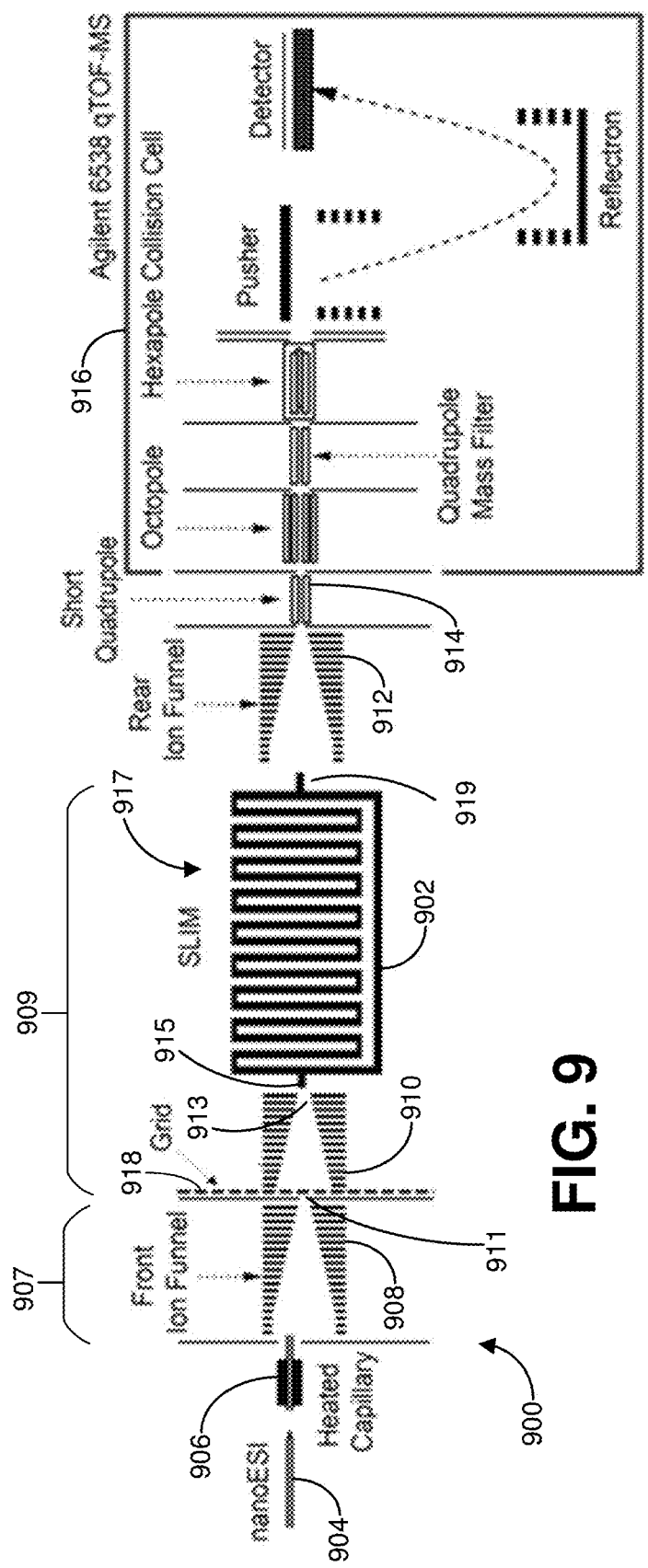
FIG. 9 is a schematic diagram of an ion manipulation system for concurrent ion separation and accumulation, and selective deposition, according to another example.

FIG. 9 shows an IMS-MS apparatus 900 that includes a SLIM 902 that concurrently separates and accumulates ions for use in TOF-MS analysis. A nanoelectrospray ionization source 904 in a negative ion mode was used for generating gas-phase ions, which were released into a heated capillary 906 to be transported into first and second pressure stages 907, 909. The first pressure stage 907 includes a first ion funnel 908 operating at approximately 3 torr and the second subsequent pressure stage 909 is coupled to the first ion funnel 908 through a conductance limiting orifice 911. The second pressure stage includes a second funnel 910 and the SLIM 902. The operating pressure of the second pressure stage 909 was maintained at approximately 0.1 torr above the region containing the first ion funnel 908 to keep neutrals out of the apparatus 900. The first and second funnels 908, 910 were operated at 20 V/cm gradients and carried opposite phase RF voltages on adjacent electrodes to provide ion confinement and focusing.

An exit 913 of the second funnel 910 is coupled to an entrance 915 of the SLIM 902. Traveling waves were applied to a serpentine electrode arrangement 917 which provide a total path length of 10 m partitioned into an ion accumulation region of 2 m and a separation region of 8 m. In the serpentine electrode arrangement 917, a DC guard voltage and RF potentials were used for ion confinement in approximately 3 torr of nitrogen. As shown in FIG. 9, an exit 919 of the SLIM 902 is coupled to a rear ion funnel 912. The ion funnel 912 is coupled to an Agilent® 6538 Q-TOF-MS 916, across a pressure limiting orifice at the end of the rear ion funnel 912 and a short quadrupole 914. A Bradbury-Nielsen (B-N) grid gate 918 was situated between the first ion funnel 908 and the second ion funnel 910 for controlling ion flow into the SLIM 902.

At the interface of the accumulation and separation regions of the SLIM 902, a relatively high DC voltage (i.e., potential) was applied to two electrodes of the ion gate coupling the two regions to enable accumulation of ions generated from the ionization source 904. The ions were subjected to a traveling waveform TWA as they moved through the accumulation region and toward the ion gate at the interface of the accumulation and separation regions. At the interface, the DC voltage prevented ions from moving onto the traveling waveform TWB of the separation region and the ions remained confined. It was found that if the amplitude of the incoming traveling waveform TWA is sufficiently low, the ions were not activated by the RF voltages and space charges as the ions were forced against the potential wall.

During ion accumulation, the voltage of the traveling waveform TWA was set at 5 V. The traveling waveform TWB of the separation region and traveling waveform TWC of the compression region were both set at 40 V for surfing the ions. After accumulating ions for different accumulation times, each set of accumulated ions were run through the TOF-MS 916 for analysis.

Figure 10:
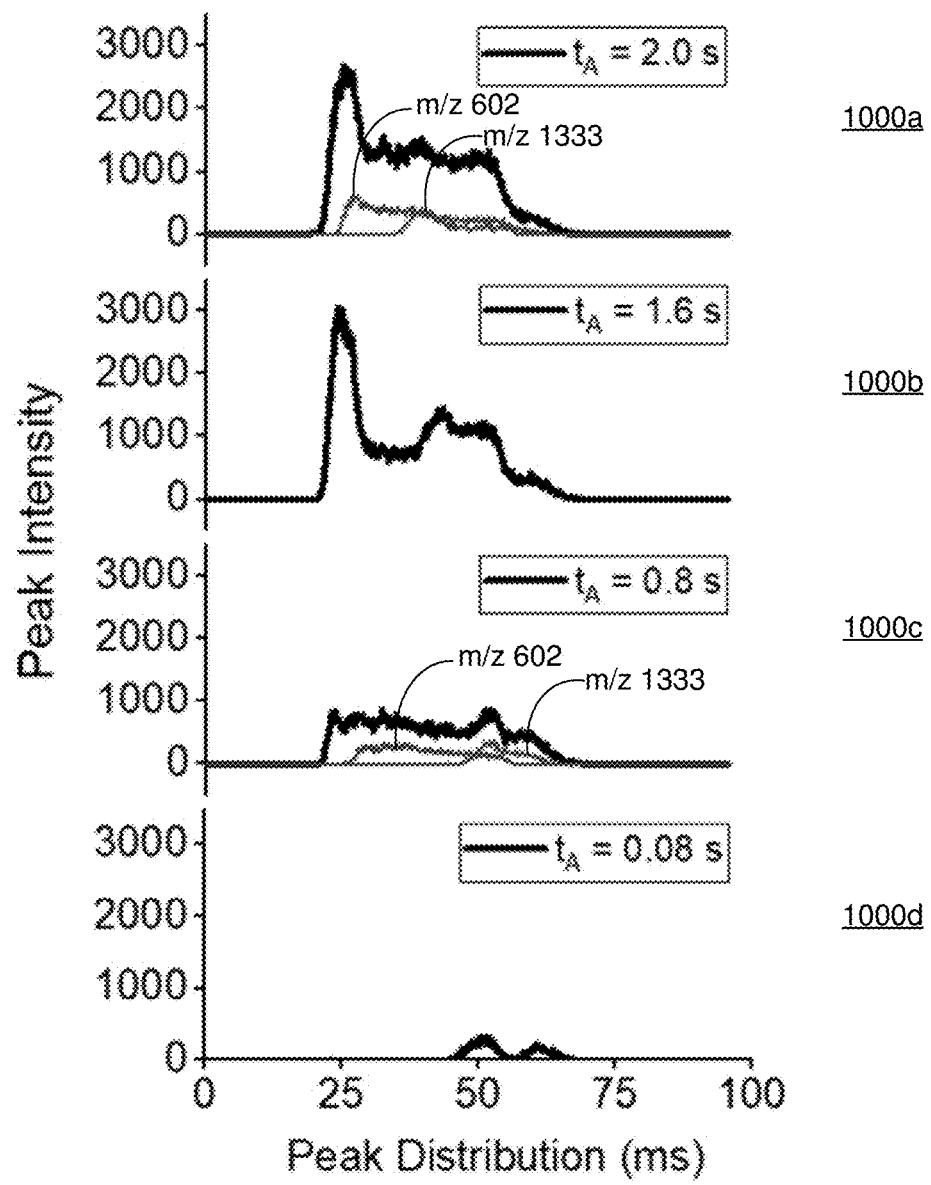
FIG. 10 is graph showing the ion peak distributions for different accumulation times.

FIG. 10 is a set of graphs 1000a-1000d of peak ion intensity with respect to arrival time for different accumulation durations provided in an accumulation region. The obtained ion arrival time distributions correspond to the ion intensity profile at the interface of accumulation and separation regions. Ion peak intensity increased with increased accumulation time, in part due to the presence of additional accumulated ions. The peak distribution width and shape varied for different accumulation durations. Distribution shapes were also affected based on ion mobility, as shown by the different distributions for ions having an m/z 602 and ions having an m/z 1334. For the accumulation times $t_A$ of 0.8 s, 0.8 s, 1.6 s, and 2.0 s the peak ion intensity steadily increased and shape varied considerably. Peak shapes occurring earlier in the distributions are due to ions being pushed against the potential wall at the interface of the traveling waveforms TWA and TWB. Subsequent relatively uniform regions are formed as the initial build-up of ions have been released. Ions were more evenly distributed at an accumulation time $t_A$ of 0.8 s. Longer accumulation durations show a larger intensity but a duration similar to the distribution durations associated with shorter accumulation times.

The voltage of the traveling waveform TWA during ion accumulation was found to govern the total number of ions accumulated without losses. For example, higher voltages during accumulation can produce voltage-induced fragmentation and/or physical losses by escaping confinement barriers. The traveling waveform TWA was varied from 4 V to 15 V with increased accumulation time $t_A$, as was the DC voltage of −50 V and −80 V at the traveling waveform TWA/TWB interface.

Figure 11:
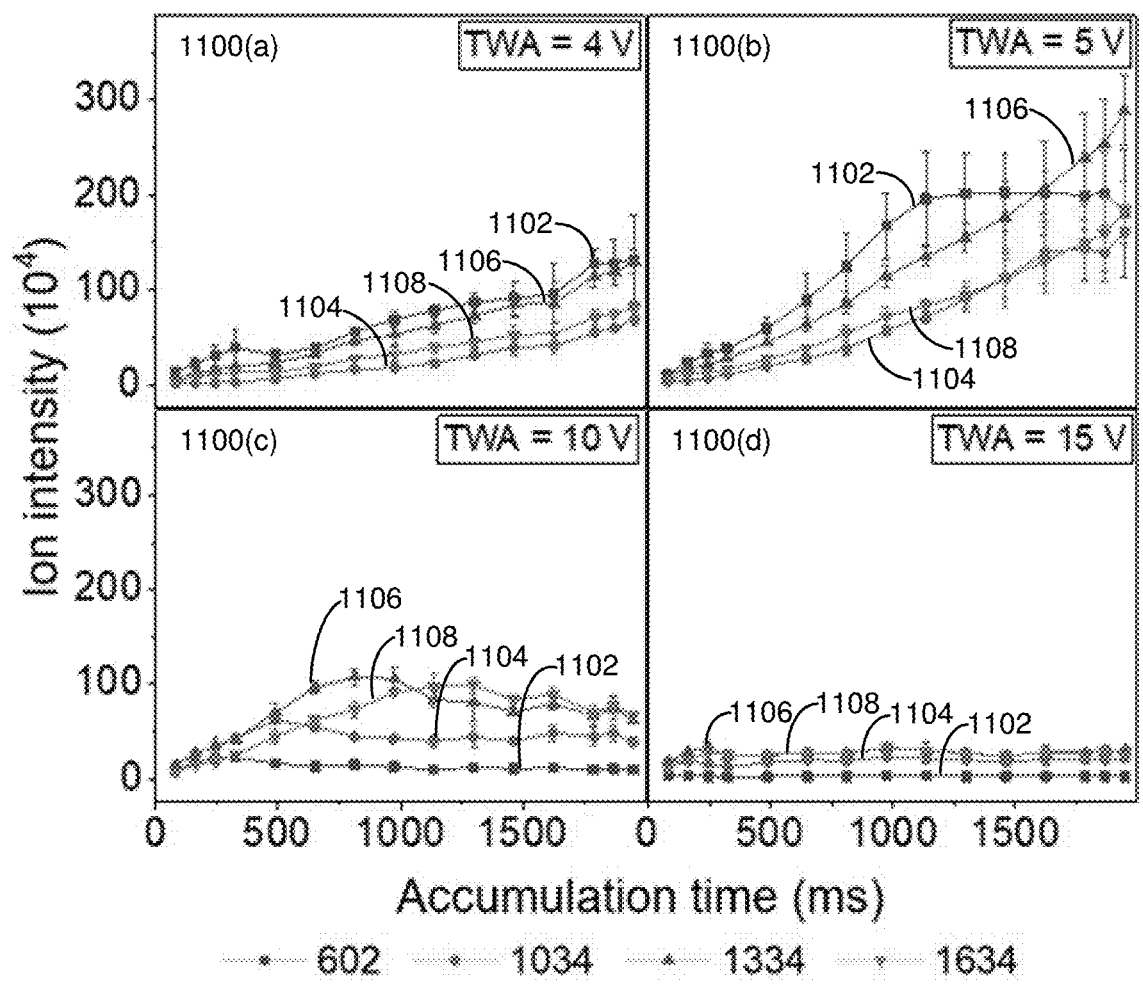
FIG. 11 is a series of graphs showing the ion intensity of an ion mixture at different traveling waveform voltages and accumulation times.

FIG. 11 is a series of graphs 1100(a)-(d) showing the ion intensity of the TOF-MS 916 tuning mixture ions 1102 (m/z 602), 1104 (m/z 1034), 1106 (m/z 1334), and 1108 (m/z 1634) at different traveling waveform TWA voltages and accumulation times. Specifically, the voltage of the traveling waveform TWA is 4V in graph 1100(a), 5V in graph 1100(b), 10 V in graph 1100(c), and 15 V in graph 1100(d). As shown in FIG. 11, increasing the accumulation time $t_A$ led to an increase in ion accumulation intensity for relatively low traveling waveform TWA voltages (e.g., graphs 1100(a)-(b)). In comparison, at higher traveling waveform TWA voltages, an increase in the accumulation time $t_A$ led to a decrease in ion accumulation intensity for a given accumulation time $t_A$. The higher voltages could have caused ions to become activated at the interface DC voltage or to be forced out of the potential well created by the RF voltages. The lower traveling waveform TWA voltages did not adversely activate ions. Consequently, increasing the traveling waveform TWA voltage from an accumulation voltage of 5V to an injection voltage of 40 V for surfing the ions, led to a sudden change in the voltage condition that could activate ions. The voltages of the traveling waveform TWA were changed at a fixed rate of 0.7 V/ms to gradually increase the voltage in the accumulation region for relatively fragile ions with improved results.

In increasing the traveling waveform TWA voltage to a surfing voltage for injecting accumulated ions into the traveling waveform TWB of the separation region, it was found that by holding the injection conditions for a minimum period of injection time $t_E$, the ions were completely injected into the separation region. The injection conditions included: (1) dropping the blocking DC voltage at the interface of the accumulation region and the separation region, (2) increasing the voltage of the traveling waveform TWA from a relatively low accumulation voltage to a surfing voltage to surf ions out of the traveling waveform TWA, and (3) closing the upstream B-N grid gate 918 to block ions from entering the SLIM 902 to enable accumulated ions to fully inject.

Figure 12A:
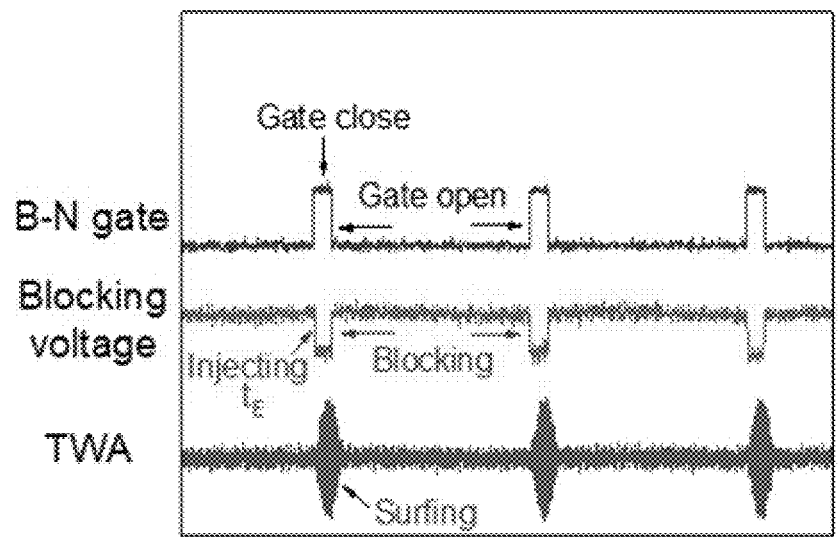
FIG. 12A is a timing diagram for a set of injection conditions for concurrent ion separation and accumulation.
Figure 12B:
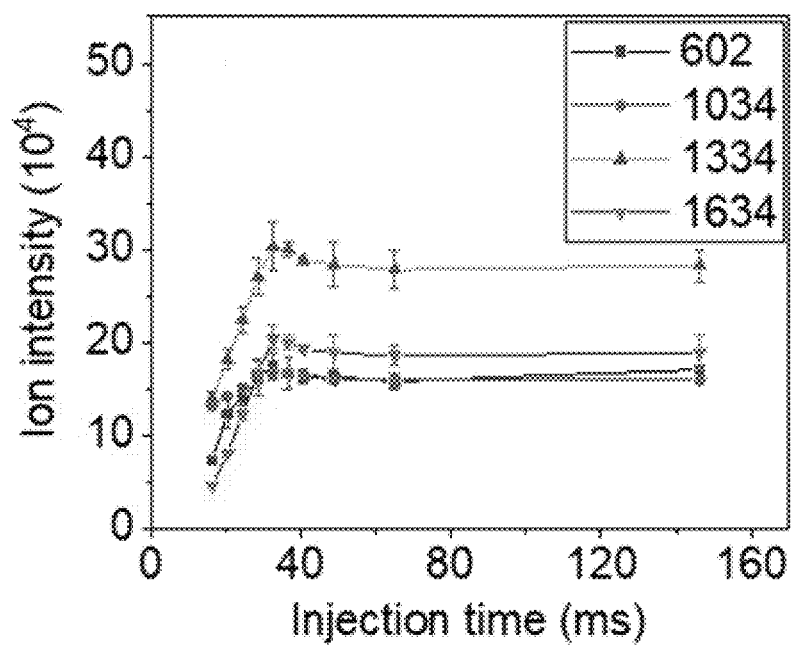
FIG. 12B is a graph showing ion signal intensity for different injection times using concurrent ion separation and accumulation.

To characterize the time for complete injection of ions, the ion intensities were recorded as a function of injection time $t_E$. FIGS. 12A-12B show a timing diagram of the injection conditions and a signal intensity for different injection times $t_E$, respectively. As shown in FIG. 12A, to inject an ion set accumulated from an earlier separation, the blocking DC voltage at the interface of the accumulation region and separation region was decreased at the beginning of the separation window, while the voltage of the traveling waveform TWA was increased to a surfing voltage of 40 V for rapid injection. The B-N grid gate 918 was in a closed state to prevent ions from entering the accumulation region during the ion injection. After ion injection, the ions were separated through traveling waveforms TWB and TWC of the separation and compression regions, respectively. At the same time, the blocking DC voltage and the traveling waveform TWA were restored to its initial value (5 V) for accumulating ions for the next separation window. The B-N grid gate 918 at this time, was in an opened state to allow ions to enter the accumulation region.

FIG. 12B shows the signal intensity of the ion packets separated for different durations of injection time $t_E$. As shown in FIG. 12B, all of the TOF-MS 916 tuning mixture ions (e.g., ions 1102-1108) were completely injected within 32 ms of injection. For injection times $t_E$ shorter than 32 ms, not of all ions were injected, while injection times $t_E$ of longer than 32 ms were workable. However, relatively longer injection times $t_E$ cause an undesired increase in analysis times, which ultimately limits ion utilization efficiency. It was determined that 32 ms of injection was sufficient to inject all ions accumulated over several seconds of accumulation time. By increasing the voltage of the traveling waveform TWA from the initial, accumulation voltage of 5V to the surfing voltage of 40 V during injection, the ion velocity was increased and thereby, the temporal width of the accumulated ion set was narrowed. This allows for relatively large ion accumulation while at the same time having short injection times $t_E$. When ions are accumulated during a separation and a new separation begins by a relatively short time-scale injection, high ion utilization efficiency is achieved since the injection time is a small fraction of the total separation time.

Figure 13:
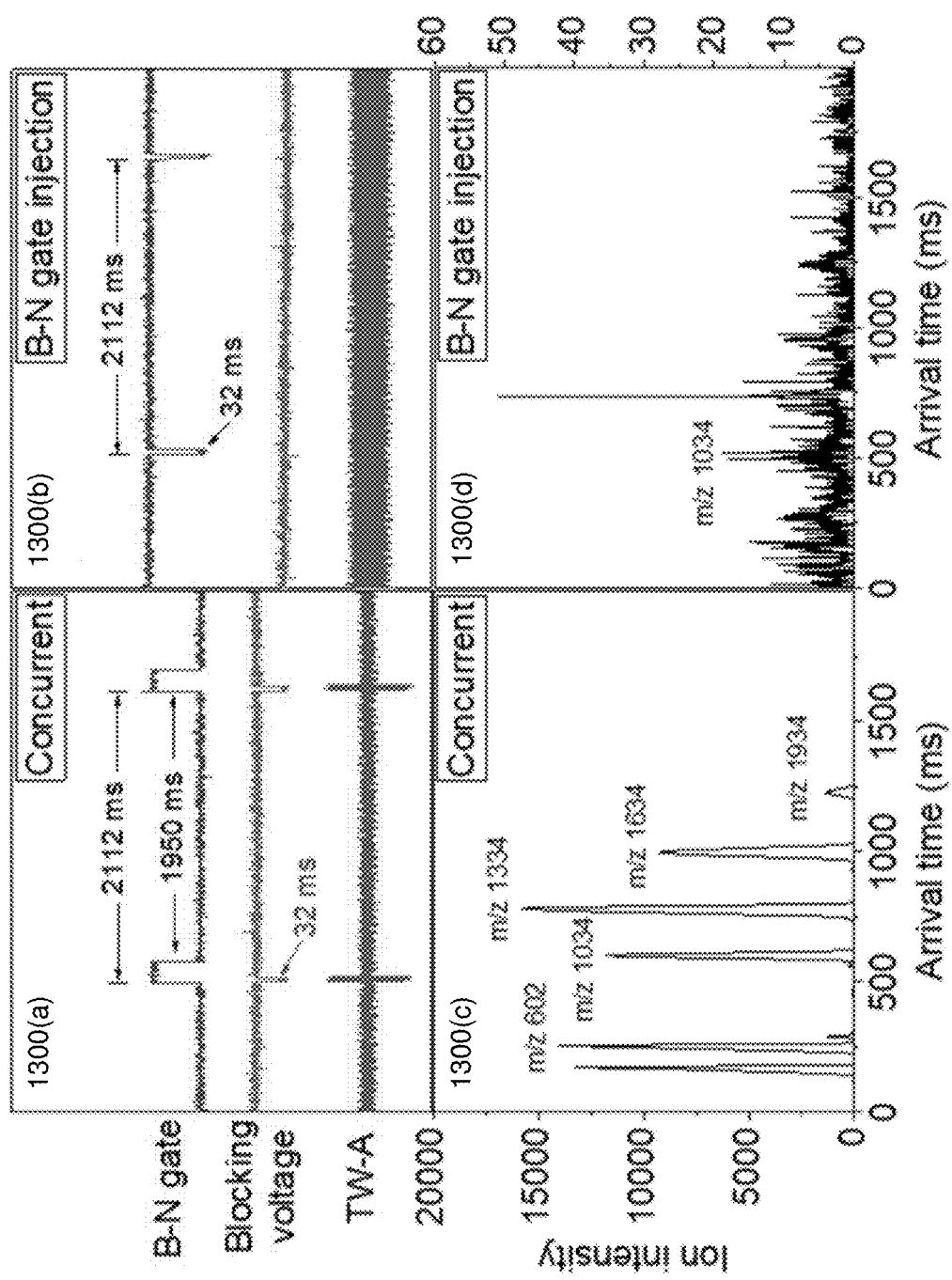
FIG. 13 is a pair of timing diagrams for a set of injection conditions and a pair of ion mobility spectrum graphs, according to one example.

The high ion utilization of concurrent separation and accumulation using the SLIM 902 was demonstrated by comparing its use with B-N gate injection. B-N gate injection does not allow for extended ion accumulation but rather injects pulses of ions, where any remaining ions are neutralized at the B-N grid gate. FIG. 13 shows the comparison between the concurrent separation and accumulation of the SLIM 902 and the B-N gate injection method using the same injection times $t_E$. As before, the TOF-MS 916 tuning mixture ions were used (e.g., having mass to charge ratios m/z 602, m/z 1034, m/z 1334, and m/z 1634).

As shown in the timing table 1300(a) for the concurrent SLIM 902 method, ions were accumulated for 1950 ms with 100% trapping efficiency (i.e. without losses) and were injected over 32 ms. The rapid separations and large trapping capacity in the SLIM 902 enabled concurrent separation and accumulation with full utilization of the ions transmitted. The ion utilization can be calculated using equation 1 below:

$$\text{Ion utilization of concurrent separation and accumulation SLIM} = \frac{t_{accumulation}}{t_{analysis}} \quad (1)$$

Here, the accumulation time to was 1950 ms and the analysis time $t_{analysis}$ was 2112 ms, which resulted in a 92.3% ion utilization efficiency. For comparison, the timing table 1300(b) shows the B-N gate injection with the same analysis time $t_{analysis}$ of 2112 ms and of injection time $t_E$ of 32 ms. As mentioned, a significant difference between the concurrent method of the SLIM 902 and B-N gate injection, among other things, is that B-N gate injection does not allow for extended ion accumulation. The ion utilization of the B-N gate injection can be calculated using equation 2 below:

$$\text{Ion utilization of } B-N \text{ grid gate injection} = \frac{t_E}{t_{analysis}} \times 100\% \quad (2)$$

Using the injection time $t_E$ of 32 ms and analysis time $t_{analysis}$ of 2112 ms, the ion utilization efficiency of the B-N gate injection was calculated to be 1.5%, significantly lower the concurrent separation and accumulation SLIM method described herein.

As shown in FIG. 13, the ion mobility spectrums 1300(c)-(d) show that significant improvement in signal intensity with high ion utilization was achieved using the concurrent SLIM 902 method over B-N injection. For instance, comparing the peaks of the ion packet whose mass to charge ratio is m/z 1034, shows that the signal intensity of the ion was improved by approximately 600 times using the concurrent separation and accumulation SLIM method as compared to using B-N gate injection. Moreover, the concurrent ion separation and accumulation using the SLIM of the disclosed technology can achieve ion utilization efficiency greater than 90%, as demonstrated above. In some instances, ion utilization efficiency greater than 95% can be achieved, e.g., an ion utilization efficiency of 100% can be achieved by modifying particular parameters that contribute to high utilization efficiency. For example, in some instances, ion utilization efficiency may be further improved via increasing the accumulation time $t_A$.

Concurrent Separation and Accumulation—Working Example 2

Figure 14:
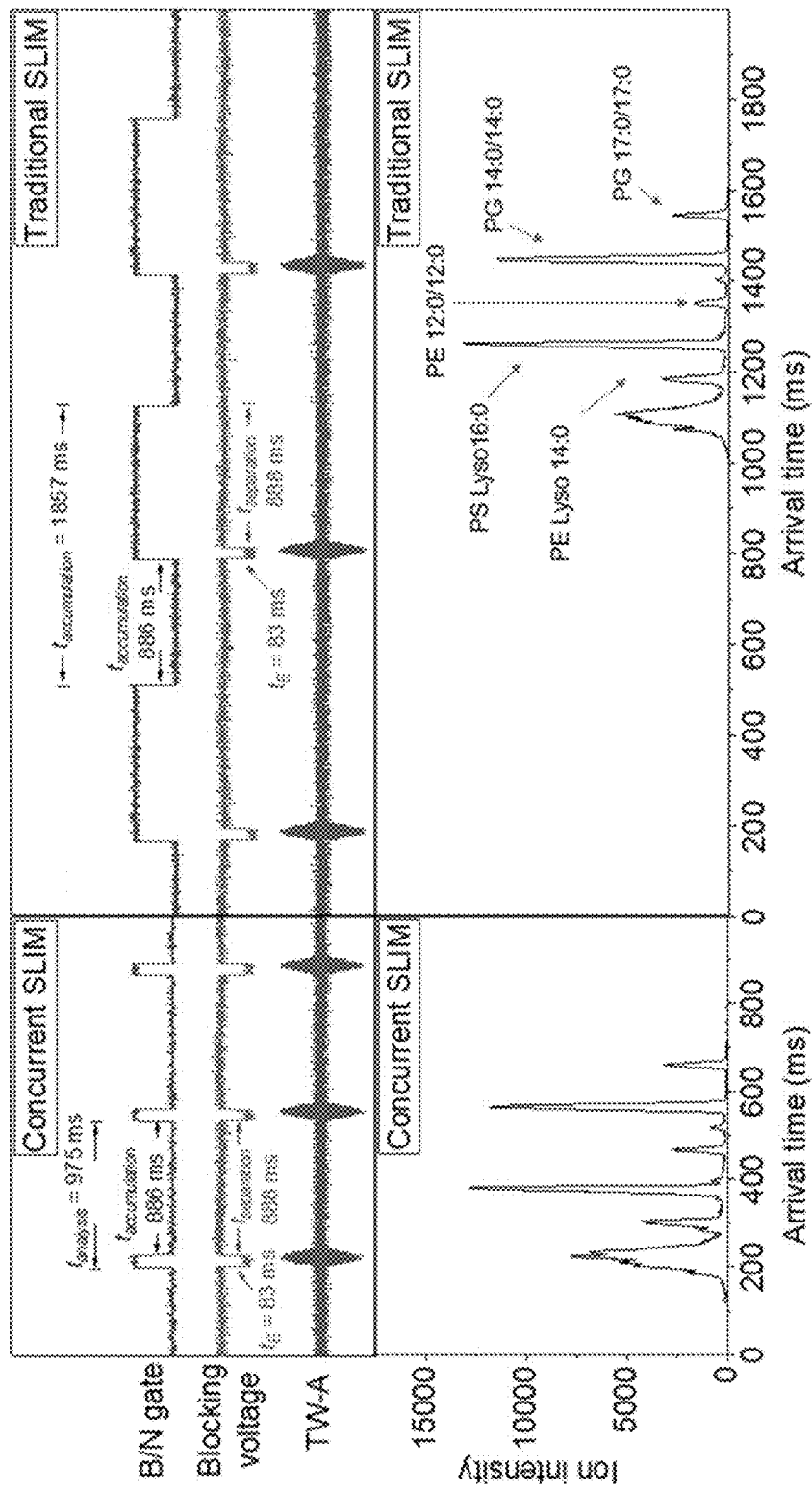
FIG. 14 is a pair of timing diagrams for a set of injection conditions and a pair of ion mobility spectrum graphs, according to another example.

Because ion separation and accumulation using the SLIM of the disclosed technology is performed concurrently, rather than consecutively as in other SLIM, the same signal intensity can be obtained in nearly half the analysis time. FIG. 14 shows an ion mobility analysis of a phospholipids mixture using the SLIM of the disclosed technology in comparison to other existing SLIM. The same accumulation time $t_A$ and separation time were used in both analyses. As shown in FIG. 14, both SLIMs achieved the same signal intensity; however, the analysis time for one ion mobility separation using the SLIM of the disclosed technology was 975 ms, while the analysis time using an existing SLIM was nearly twice as long, at 1857 ms. Accordingly, as reflected in FIG. 14, the concurrent separation and accumulation SLIM improves throughput by nearly twice as much as other existing SLIM.

Concurrent Separation and Accumulation—Working Example 3

Figure 15:
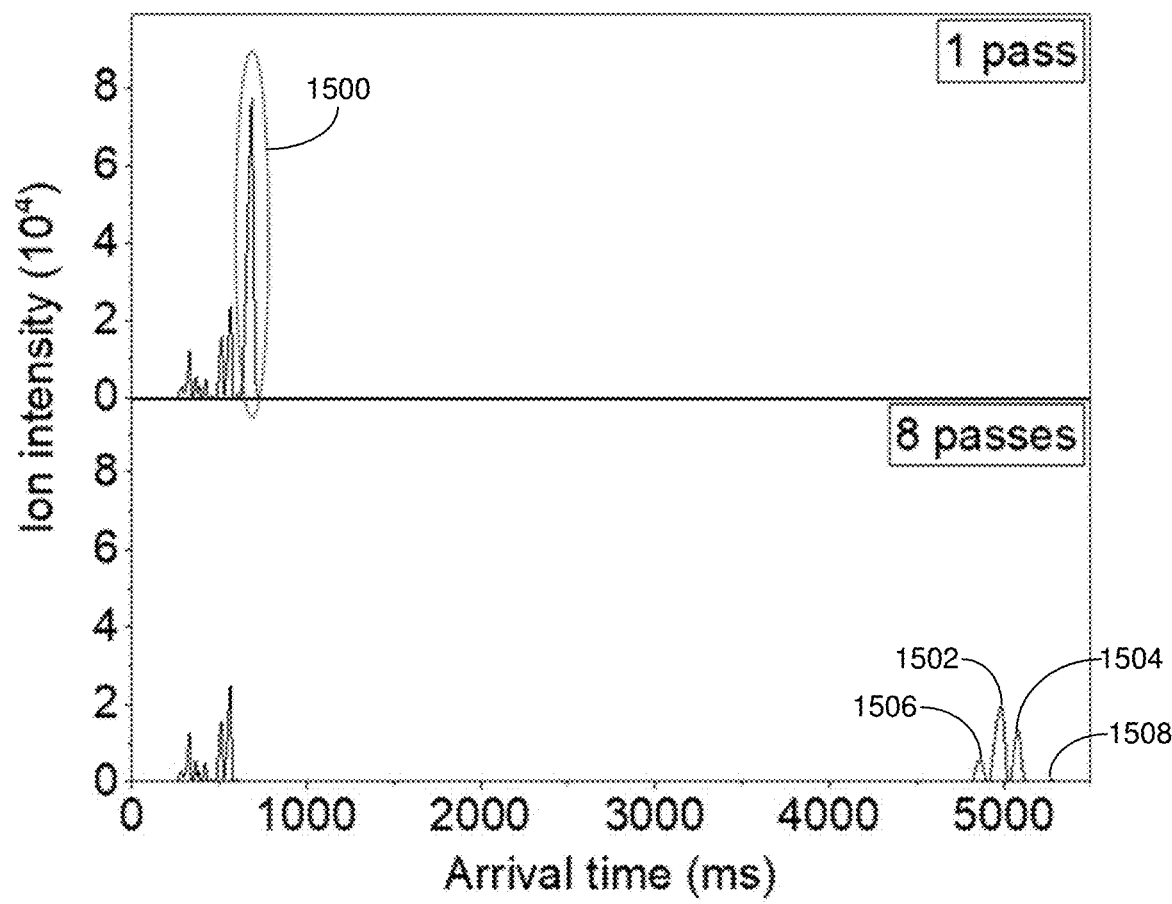
FIG. 15 is a graph showing an ion peak selected for multi-pass separation.

Two phospholipid isomers were selected to be separated from a lipid mixture using the multi-pass cycling using the SLIM of the disclosed technology. As shown in FIG. 15, a peak 1500 containing two isomers (PG 18:1/18:1 del9-trans and del9-cis) was selected for multi-pass separation by switching the DC switch for recirculating the two isomers back into the separation region, while other components were directed to a mass spectrometer for detection without cycling. During the multi-pass separation of the isomer peak, ions were continuously accumulated within the accumulation region for the next separation. Baseline separation of the two isomers 1502, 1504 was achieved after 8 passes of recirculation cycling, (e.g., approximately 100 m). Two small peaks 1506, 1508 close to the two isomer peaks 1502, 1504 with close collision cross section were also observed, which were lipid PG 17:0/17:0 (~4850 ms) and PS 18:0/18:0 (~5200 ms). The total peak area of the four components were same before and after the 8-pass cycling, which reflects the high-resolution separation on isomers with lossless ion cycling and high ion utilization using the SLIM of the disclosed technology.

Accordingly, the switch region within the disclosed SLIM can be switched to redirect these particular isomers to the deposition region for non-destructive collection of the redirected components. For instance, the four isomer components 1502-1508 of the lipid mixture separated after the 8-pass ion cycling in FIG. 15, can be redirected to the deposition region to the collect the isolated and selected del9-trans and del9-cis PG 18:1/18:1 phospholipid isomers 1502, 1504. Additionally, or alternatively, rather than directing the other components of lipid mixture to a mass spectrometer during separation of the isomers 1502-1508, the other components can be directed to the deposition region for collection while a high-resolution separation of the two selected isomers is achieved through multi-pass cycling.

Selective Ion Deposition—Example

Figure 18:
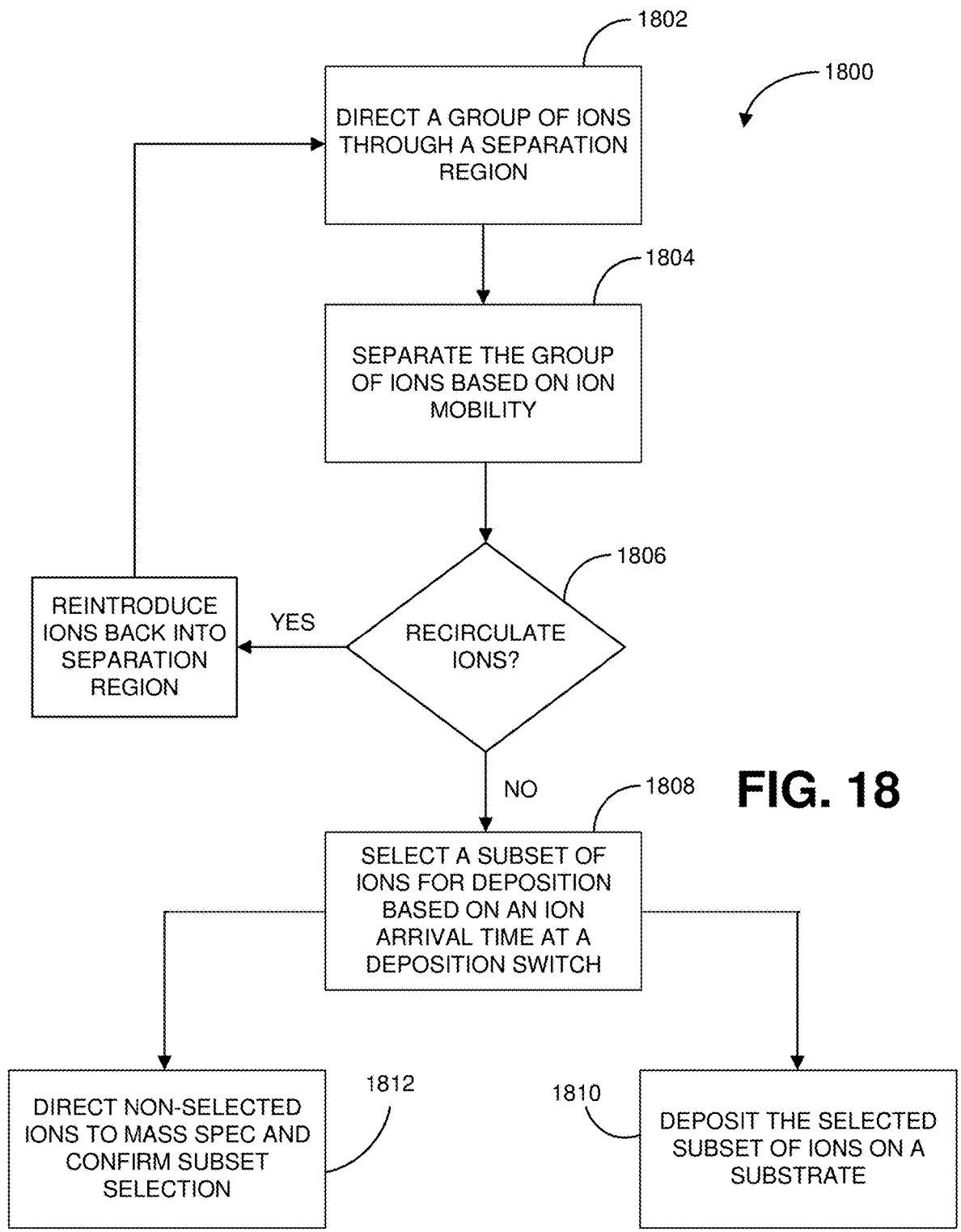
FIG. 18 is a schematic diagram of a representative method for selective deposition, according to one example.

FIG. 18 is a method 1800 for selective deposition based on ion mass and mobility using a SLIM of the disclosed technology. At 1802, the method 1800 includes directing a group of ions through a separation region of the SLIM. The group of ions can be a group of ions sharing the same mass-to-charge ratio (m/z) and/or m/z peak. A common or same m/z can refer to a plurality of adjacent mass spectrum peaks defined for a molecule. The group of ions can also be a first group of ions earlier received from an accumulation region through an ion gate situated at an interface of the separation and accumulation regions where the two regions are coupled.

At 1804, the method 1800 includes separating the group of ions in the separation region based on ion mobility. A traveling waveform of the separation region is configured to separate the group of ions into subsets of ions based on ion mobility. A subset of ions can be a single set or a set of two or more ion structures from the group of ions sharing the same m/z ratio and/or m/z peak. In some instances, the subset of ions can be a single set or a set of two or more isomers of a given ion species.

Ion mobility of the subset of ions depends on both the mass and structure of the ions. Ions having a smaller mass, for instance, tend to move through the separation region in less time than ions having a comparatively larger mass. Ion mobility is also influenced by the structure of the subset of ions. In particular, ions with a compact structure generally arrive at an ion exit or switch region of the SLIM in less time than ions having the same mass but having an extended structure. This separation based on structure can be due to interactions with a collision gas. Isomers of a given ion species, for example, can have the same mass but different ion mobilities due to variations in the isomer structures, variations which can be difficult to distinguish based on mass alone.

Figure 19:
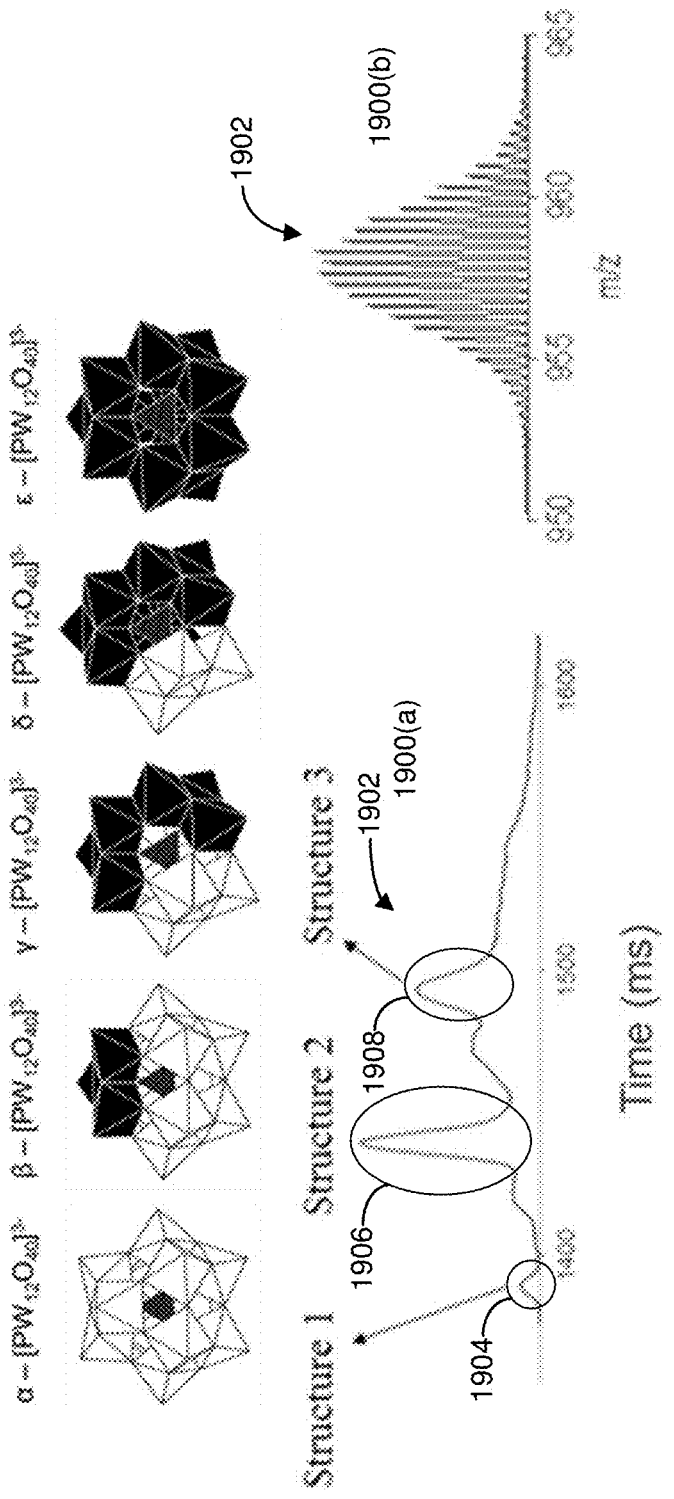
FIG. 19 is an ion mobility spectrum and a mass spectrum for a representative group of ions.

To illustrate, FIG. 19 shows an ion mobility spectrum 1900(a) and a mass spectrum 1900(b) for isomers of phosphotungstic acid (WPOM). WPOM is a polyoxometalate and Keggin structure having five isomer structures (e.g., isomers α-, β-, γ-, δ-, and ε-WPOM). As shown in the mass spectrum 1900(b) for the WPOM group of structures, the structures of the individual isomers are indistinguishable from one another based solely on the m/z of WPOM. Each peak 1904, 1906, 1908 within the ion mobility spectrum 1900(a) by contrast, corresponds to an ion arrival time of a subset of ions corresponding to a single isomer within the m/z range of the WPOM group, making the isomer structures distinct from one another based on ion mobility (e.g., arrival time). Since the structure of ions also influences functionality of ions, ions can also be separated and selected according to their functionality. Ion mobility is a metric by which particular ions of interest can be selected for deposition due to the correlation between ion mobility and the structure and functionality of the ions.

In representative examples, ion mobility of the subset of ions is determined from an ion mobility spectrum obtained by a SLIM-MS of the disclosed technology. In such examples, an initial ion mobility spectrum of the group of ions can be obtained by first separating the group of ions and then directing the group of ions to the MS coupled to an ion exit of the SLIM. After which, the ion mobility of the subset of ions is determined. In other examples, ion mobility for the subset of ions is determined prior to any separation, such as by SLIM/IMS-MS analysis and/or other data or information indicating the relative ion mobility of the subset of ions.

At 1806, an optional step can be executed in which the group of ions (or subsets of ions) having traveled through at least a portion of the separation region can be selected for recirculation and reintroduced back into the separation region for further separation. Multiple passes of the ions through the separation region can improve structurally selectivity of one or more subsets of ions through further time and spatial separation. If the group and/or subsets of ions are not selected for recirculation and/or are at the end of multi-pass cycle through the separation region, the subsets of ions are directed to a switch region of the SLIM, where each subset is directed to either a deposition region or to the MS via the ion exit.

An ion arrival time at a deposition switch of the SLIM can be determined based on the ion mobility of a given subset of ions and the parameters of separation (e.g., path length, board gap, voltage, pressure, wave profiles, gas density, etc.). At 1808, a subset of separated ions can be selected based on an ion arrival time of the subset of ions at a deposition switch situated within the switch region of the SLIM. Based on the ion arrival time for the selected subset, as the subset approaches and arrives at the deposition switch, the voltages applied to electrodes at the deposition switch are changed to direct the selected subset of ions to the deposition region. The ion arrival time can account for the mass and relative ion mobility of the selected subset of ions as well as the parameters of separation. Parameters including the particular path length of separation of the selected subset, such as through a single or multi-pass separation.

After the selected subset of ions have been directed to the deposition region, the selected subset of ions moves through a channel of the deposition region and is fed into a deposition system coupled to an outlet of the deposition channel. At 1810, the selected subset of ions is deposited and/or printed on one or more substrates in predetermined locations, such as common and/or distinct locations on one or more substrates. In some examples, depositing the ions further includes separating the selected subset of ions in the deposition region based on ion polarity, such as by through a biased voltage. In such examples, the selected subset ions can be deposited on a substrate based on polarity.

In some examples, at 1812, ions that are not selected for deposition can be directed to an ion exit coupled to a mass spectrometer or mass analyzer. The time-dependent mass spectrum profile can then be compared to an expected time-dependent mass spectrum profile to determine the absence of an isomer peak corresponding to the selected subset of ions directed for deposition. This comparison can be used to confirm the quality of the selection and the accuracy of selected ion arrival time used to control the switching of the deposition switch.

In representative examples, the method 1800 can be implemented and combined with the methods, apparatus, and systems for concurrent ion separation and accumulation of the disclosed technology. As one example, separating a first group of ions of ions can include accumulating a second group of ions while separating the first group of ions in the separation region. Including concurrent separation and accumulation in selective deposition can, for example, increase ion utilization and deposition efficiency, and prevent undesired waste of ions often experienced in traditional, continuous flow mass selection.

In some examples, separating the group and/or subset of ions also includes compressing the ions in a compression region coupled to the separation region. A traveling waveform of the compression region includes a stuttering or variable duty cycle traveling waveform that can increase the peak intensity or narrow peak width of the subset of ions, thereby reducing peak spreading that can occur over long path lengths, such as a single or multiple passes through the SLIM.

Selective Ion Deposition—Working Example

Figure 20:
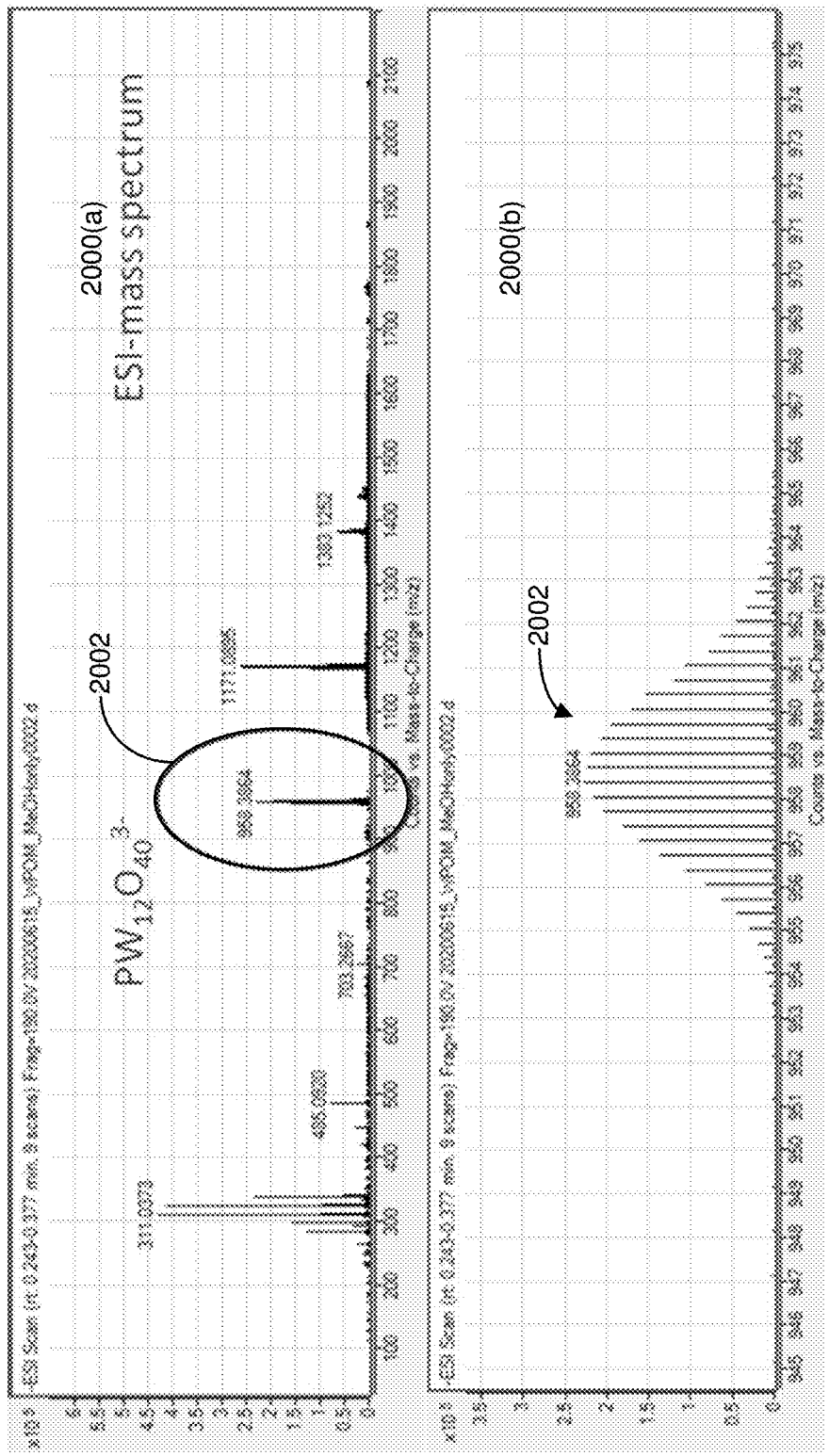
FIG. 20 is a pair of mass spectrums showing the mass-to-charge ratio for a group of ions.

An example SLIM according to the disclosed technology was used in performing highly selective material deposition of isomers of a polyoxometalate. In particular, three isomers of phosphotungstic acid (WPOM) of interest were separated, selected, and deposited using soft-landing deposition. As mentioned, WPOM is a Keggin structure having five isomers (e.g., FIG. 19). As shown in the full ESI-mass spectrum 2000($a$) and zoomed-in ESI-mass spectrum 2000($b$) of FIG. 20, a characteristic m/z 2002 for WPOM was identified via a triply charged peak at m/z 958.4. Due to the low sensitivity and resolution of MS, the structural variations of the individual Keggin structures were unidentifiable from the mass spectrums 2000($a$)-2000($b$) alone.

Figure 21:
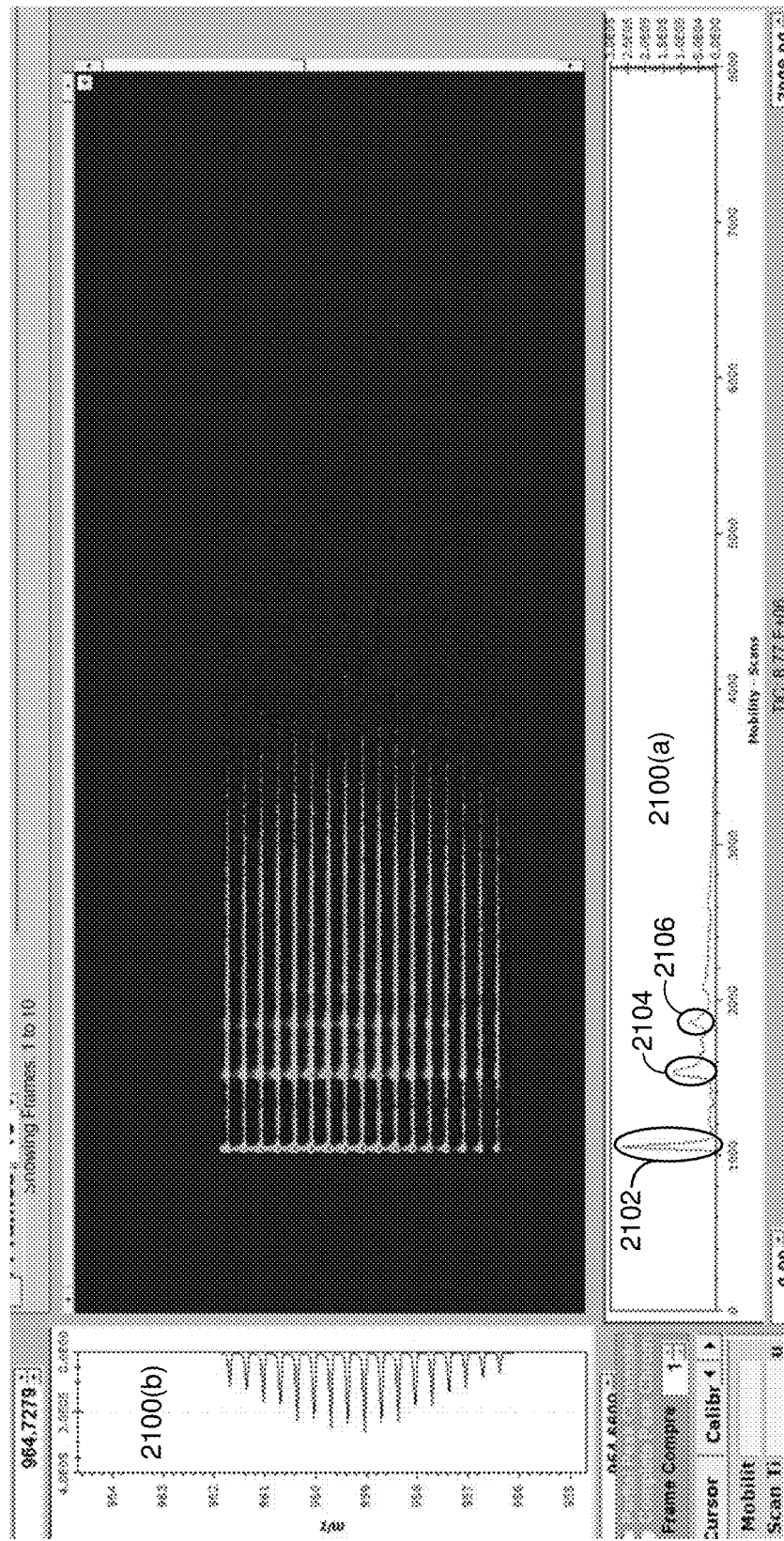
FIG. 21 is an ion mobility spectrum used in selective deposition of ions, according to one example.

FIG. 21 shows an ion mobility spectrum 2100($a$) obtained from a combination of a SLIM of the disclosed technology coupled with a MS. The X-axis of the ion mobility spectrum 2100($a$) is scaled quantity which can be reduced to milliseconds and a corresponding time of arrival. Peaks within the ion mobility spectrum 2100($a$) correspond with an arrival time of one of the three isomers within the shared m/z peak of WPOM, which is shown in the mass spectrum 2100($b$). Specifically, the ion mobility spectrum 2100($a$) shows a peak for each of the α-, β-, and γ-WPOM isomers 2102-2106 of interest. From the ion mobility spectrum 2100($a$) each of the isomers were selected according to their mass and mobility for selective deposition. In particular, an ion arrival time for the three isomers 2102-2106 at a deposition switch of the SLIM was determined. Based on the ion arrival time for each isomer 2102-2106 and during a subsequent separation, the deposition switch directed each isomer 2102-2106 of interest to the deposition region.

Figure 22:
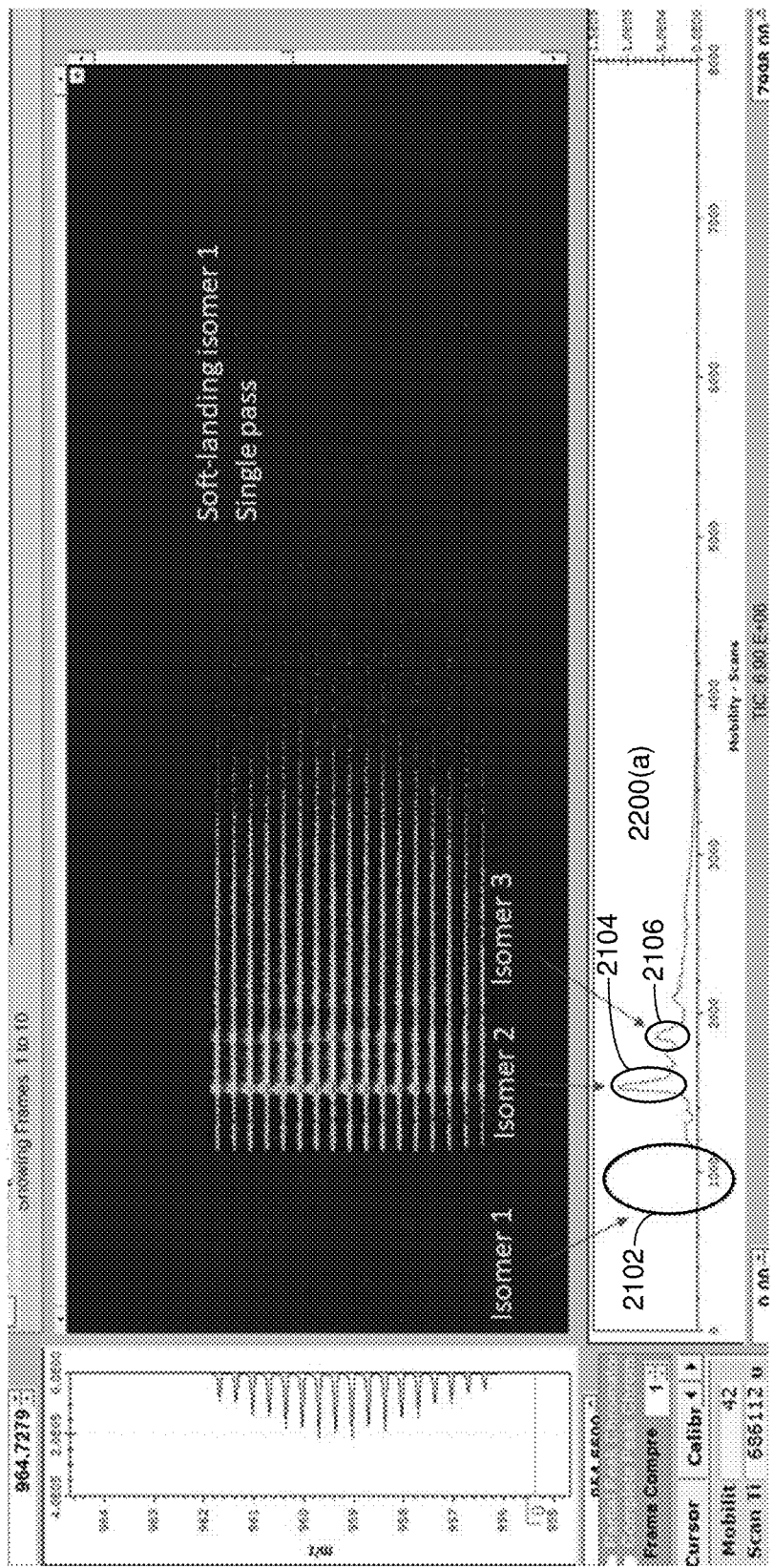
FIG. 22 is an ion mobility spectrum used in selective deposition of ions, according to another example.

Separation and selective deposition of the individual isomers 2102-2106 was confirmed by first directing and soft-landing the α-WPOM isomer 2102, and subsequently using soft-landing deposition to study the current of the deposited α- and β-WPOM isomers 2102-2104. FIG. 22, for instance, shows an ion mobility spectrum 2200($a$) obtained after directing only the α-WPOM isomer 2102 for soft-landing deposition after a single pass (e.g., without recirculation) through the SLIM. As shown in FIG. 22, the absence of the α-WPOM isomer 2102 peak in the ion mobility spectrum 2200($a$) confirms that the α-WPOM isomer 2102 was separated and directed for deposition, while the β-, and γ-WPOM isomers 2104-2106 were directed to the MS to obtain the ion mobility spectrum 2200($a$).

Figure 23:
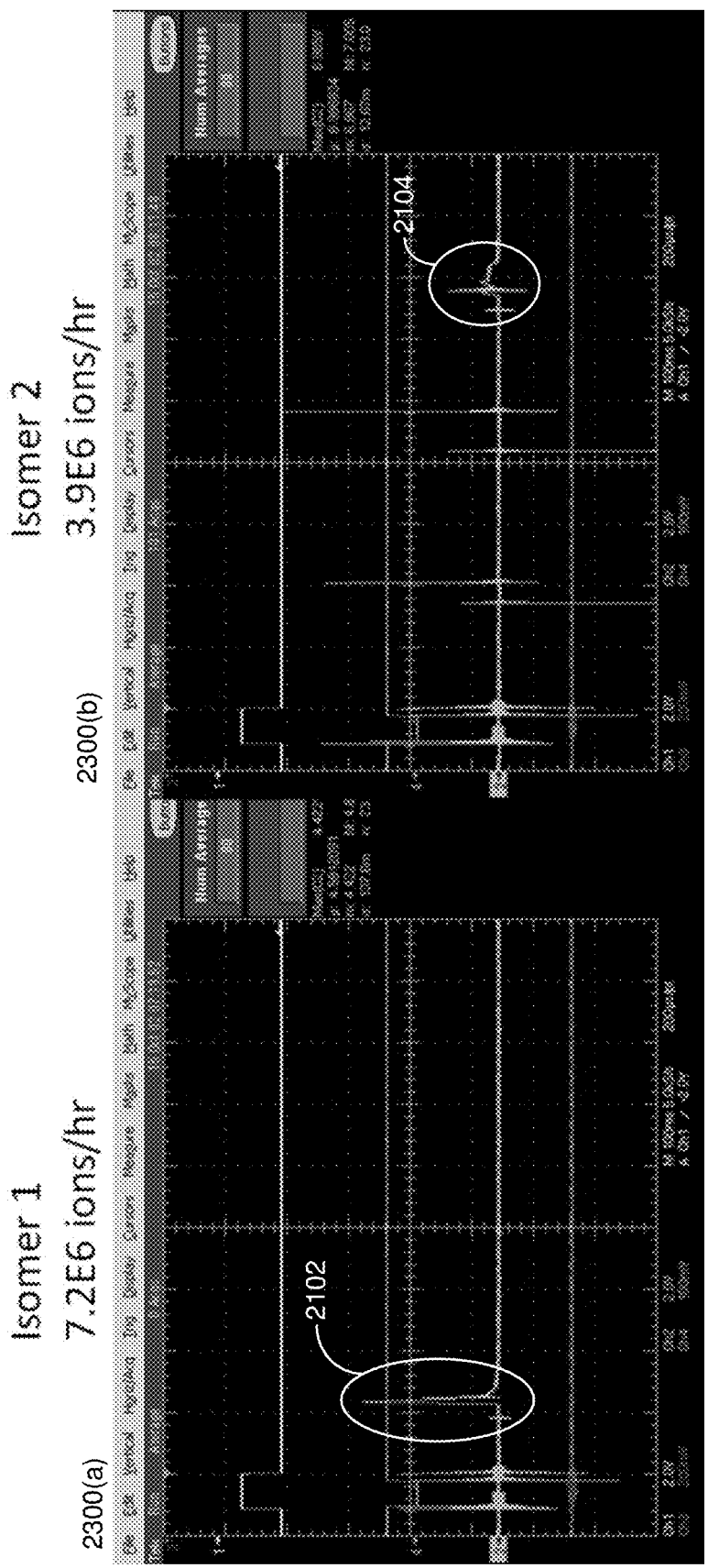
FIG. 23 is a pair of graphs showing a soft-landing current for two deposited ion subsets.

The graphs 2300($a$)-2300($b$) of FIG. 23 show a soft-landing current of the deposited samples of the α- and β-WPOM isomers 2202-2204 on a deposition plate coupled to a current amplifier. The electric field between SLIM and the deposition plate was 30 V/cm (150 V drop over 5 cm) to provide a low kinetic energy for the ions (0.03 eV) to deposit them without surface induced structural modification. As shown in the graphs 2300($a$)-2300($b$), $7.2 \times 10^6$ α-WPOM isomers 2102 ions were deposited per hour and $3.9 \times 10^6$ β-WPOM isomers 2104 ions per hour. Graphs 2300($a$)-2300($b$) confirmed successful selective deposition of the isomers of interest.

In view of the many possible embodiments to which the principles of the disclosed technology may be applied, it should be recognized that the illustrated embodiments are only preferred examples and should not be taken as limiting the scope of the disclosure. We therefore claim all that comes within the scope of the appended claims.

We claim:

1. A method, comprising:
directing a group of ions through a separation region of an ion manipulation apparatus;
separating the group of ions in the separation region based on ion mobility;
reintroducing the group of ions having traveled at least partially through the separation region back into the separation region;
selecting a subset of the group of ions based on a dependence between ion mobility and ion arrival time of the separated ions at a deposition switch of the ion manipulation apparatus; and
depositing the selected subset of ions on a substrate.

2. The method of claim 1, wherein the selecting the subset of ions based on the ion arrival time at the deposition switch comprises selecting one or more structures of a molecule based on predetermined expected ion arrival times at the deposition switch for the selected one or more structures.

3. The method of claim 1, wherein the ions of the group of ions have a common mass-to-charge ratio and/or mass spectrum peak.

4. The method of claim 1, wherein the selected subset of ions comprises fewer than all of a plurality of ion structures included in the group of ions.

5. The method of claim 1, wherein the selected subset of ions comprises fewer than all of a plurality of isomers included in the group of ions.

6. The method of claim 1, wherein the selecting the subset of the group of ions comprises selecting from an ion mobility spectrum fewer than all of a plurality of ion mobility peaks corresponding to the selected subset of ions.

7. The method of claim 1, further comprising, before selecting the subset of the group of ions:
directing the group of ions to an ion receiver coupled to an ion exit of the ion manipulation apparatus and configured to provide mass selection of the ions from which the subset of the group of ions is selected.

8. The method of claim 1, wherein the selecting a subset of the group of ions comprises switching the deposition switch to direct the separated ions to a deposition region based on the ion arrival time.

9. The method of claim 1, wherein the group of ions is a first group of ions earlier received from an accumulation region coupled to the separation region.

10. The method of claim 9, further comprising:
accumulating a second a group of ions in the accumulation region while separating the first group of ions in the separation region.

11. The method of claim 1, further comprising:
compressing at least a portion of the group of ions separated in the separation region.

12. The method of claim 1, further comprising:
separating the separated ions based on ion polarity using an applied voltage difference by separating ions of different polarity spatially in a common channel of the ion manipulation apparatus and/or by separating ions of different polarity to propagate along different polarity-specific paths.

13. The method of claim 1, wherein depositing the selected subset ions comprises depositing the separated ions at predetermined locations on the substrate.

14. The method of claim 1, wherein depositing the selected subset ions comprises depositing the separated ions at a common location on the substrate.

15. The method of claim 1, wherein depositing the selected subset ions comprises printing three-dimensional structures using the separated ions.

16. The method of claim 1, wherein depositing the selected subset ions comprises depositing the separated ions on different respective substrates.

17. The method of claim 1, further comprising, confirming the selection of the subset by directing other ions of the group of ions that are not part of the subset to a mass spectrometer and comparing a detected time-dependent ion arrival time profile from the mass spectrometer with an expected time-dependent ion arrival time profile.

18. A method, comprising:
directing a group of ions through a separation region of an ion manipulation apparatus;
separating the group of ions in the separation region based on ion mobility;
compressing at least a portion of the group of ions separated in the separation region;
selecting a subset of the group of ions based on a dependence between ion mobility and ion arrival time of the separated ions at a deposition switch of the ion manipulation apparatus; and
depositing the selected subset of ions on a substrate.

* * * * *

UNITED STATES PATENT AND TRADEMARK OFFICE
CERTIFICATE OF CORRECTION

| | | |
|---|---|---|
| PATENT NO. | : 12,354,835 B2 | Page 1 of 1 |
| APPLICATION NO. | : 17/314928 | |
| DATED | : July 8, 2025 | |
| INVENTOR(S) | : Garimella et al. | |

It is certified that error appears in the above-identified patent and that said Letters Patent is hereby corrected as shown below:

In the Specification

Column 2, Line 5, "a second a group of ions" should read --a second group of ions--

Column 14, Line 49, "can also configured" should read --can also be configured--

Column 15, Line 11, "137 be configured" should read --137 configured--

Column 15, Line 25, "ions to through an" should read --ions through an--

Column 26, Lines 25-26, "significantly lower the" should read --significantly lower than the--

Column 27, Line 31, "to the collect the" should read --to collect the--

In the Claims

Column 31, Line 25, "a second a group of ions" should read --a second group of ions--

Signed and Sealed this
Second Day of December, 2025

John A. Squires
*Director of the United States Patent and Trademark Office*